(12) United States Patent
Favale, Jr. et al.

(10) Patent No.: US 12,237,451 B2
(45) Date of Patent: Feb. 25, 2025

(54) ARRANGEMENTS OF LIGHT-ALTERING COATINGS IN LIGHT-EMITTING DIODE PACKAGES

(71) Applicant: CreeLED, Inc., Durham, NC (US)

(72) Inventors: Joseph M. Favale, Jr., Cary, NC (US); Robert David Schmidt, Wake Forest, NC (US)

(73) Assignee: CreeLED, Inc., Durham, NC (US)

( * ) Notice: Subject to any disclaimer, the term of this patent is extended or adjusted under 35 U.S.C. 154(b) by 295 days.

(21) Appl. No.: 17/587,215

(22) Filed: Jan. 28, 2022

(65) Prior Publication Data

US 2023/0246144 A1 Aug. 3, 2023

(51) Int. Cl.
*H01L 33/60* (2010.01)
*H01L 25/075* (2006.01)
(Continued)

(52) U.S. Cl.
CPC .......... *H01L 33/60* (2013.01); *H01L 25/0753* (2013.01); *H01L 33/54* (2013.01); *H01L 33/56* (2013.01); *H01L 33/62* (2013.01)

(58) Field of Classification Search
CPC ..... H01L 33/60; H01L 25/0753; H01L 33/54; H01L 33/56; H01L 33/62
See application file for complete search history.

(56) References Cited

U.S. PATENT DOCUMENTS 3,875,456 A 4/1975 Kano et al.
8,049,230 B2 11/2011 Chan et al.
(Continued)

FOREIGN PATENT DOCUMENTS

TW 201924094 A 6/2019
TW M610787 U 4/2021

OTHER PUBLICATIONS

International Search Report and Written Opinion for International Patent Application No. PCT/US2023/061223, mailed Apr. 20, 2023, 15 pages.
(Continued)

*Primary Examiner* — Mohammad A Rahman
(74) *Attorney, Agent, or Firm* — Withrow & Terranova, P.L.L.C.

(57) ABSTRACT

Light-emitting diode (LED) packages, and more particularly arrangements of light-altering coatings in LED packages are disclosed. Exemplary LED packages may include lead frame structures that are at least partially encased by a housing. Arrangements of light-altering coatings may be provided that cover one or more portions of lead frame structures exposed within LED package recesses. By providing light-altering coatings that cover lead frame structures within package recesses, negative impacts from potential lead frame discoloration due to environmental exposure may be reduced. Additionally, such light-altering coatings may be configured to reflect light emissions from LED chips before reaching portions of lead frame structures. Light-altering coating arrangements are disclosed where light-altering coatings are arranged in contact with LED chips or, alternatively, in a spaced relationship with LED chips. Retention structures are disclosed that may define boundaries of light-altering coatings along recess floors of corresponding LED packages.

20 Claims, 13 Drawing Sheets

(51) Int. Cl.
*H01L 33/54* (2010.01)
*H01L 33/56* (2010.01)
*H01L 33/62* (2010.01)

(56) References Cited

U.S. PATENT DOCUMENTS

| | | | |
|---|---|---|---|
| 8,154,043 | B2 | 4/2012 | Andrews et al. |
| 8,368,112 | B2 | 2/2013 | Chan et al. |
| 8,610,140 | B2 | 12/2013 | Joo et al. |
| 9,831,393 | B2 | 11/2017 | Chan et al. |
| 10,522,518 | B2 | 12/2019 | Ng et al. |
| 10,950,769 | B2 | 3/2021 | Bergmann et al. |
| 2008/0054287 | A1 | 3/2008 | Oshio et al. |
| 2011/0051043 | A1 | 3/2011 | Kim et al. |
| 2013/0208442 | A1 | 8/2013 | Reiherzer |
| 2013/0307013 | A1 | 11/2013 | Chan et al. |
| 2014/0071689 | A1 | 3/2014 | Yoon et al. |
| 2014/0085884 | A1 | 3/2014 | Horio et al. |
| 2015/0092414 | A1 | 4/2015 | Okura |
| 2018/0083169 | A1 | 3/2018 | Naka et al. |
| 2018/0301438 | A1 | 10/2018 | Chan et al. |
| 2019/0123247 | A1 | 4/2019 | Isono et al. |
| 2019/0123250 | A1 | 4/2019 | Li |
| 2020/0227603 | A1 | 7/2020 | Pun et al. |
| 2021/0329758 | A1* | 10/2021 | Francis .................. H01L 33/50 |
| 2022/0102596 | A1* | 3/2022 | Matsuda ................. H01L 33/54 |

OTHER PUBLICATIONS

International Search Report and Written Opinion for International Patent Application No. PCT/US2023/013405, mailed Jun. 6, 2023, 13 pages.

Office Action for Taiwanese Patent Application No. 112102313, mailed Jul. 11, 2024, 20 pages.

Non-Final Office Action for U.S. Appl. No. 17/686,943, mailed Jan. 10, 2025, 16 pages.

* cited by examiner

ARRANGEMENTS OF LIGHT-ALTERING COATINGS IN LIGHT-EMITTING DIODE PACKAGES

FIELD OF THE DISCLOSURE

The present disclosure relates to light-emitting diode (LED) packages, and more particularly to arrangements of light-altering coatings in LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching an interface between an LED surface and the surrounding environment or even an internal interface of the LED can be either refracted or internally reflected. If photons are internally reflected in a repeated manner, then such photons eventually are absorbed and never provide visible light that exits an LED.

LED packages have been developed that can provide mechanical support, electrical connections, and encapsulation for LED emitters. Lumiphoric materials, such as phosphors, may also be arranged in close proximity to LED emitters to convert portions of light emissions to different wavelengths. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to light-emitting diode (LED) packages, and more particularly to arrangements of light-altering coatings in LED packages. Exemplary LED packages may include lead frame structures that are at least partially encased by a housing. Arrangements of light-altering coatings in LED packages may be provided that cover one or more portions of lead frame structures that may be exposed within package recesses. By providing light-altering coatings that cover lead frame structures within package recesses, negative impacts from potential lead frame discoloration due to certain environmental exposure may be reduced. Additionally, such light-altering coatings may be configured to reflect light emissions from LED chips before such light emissions reach portions of lead frame structures. Light-altering coating arrangements are disclosed where light-altering coatings are arranged in contact with LED chips or, alternatively, in a spaced relationship with LED chips. Retention structures are disclosed that may define boundaries of light-altering coatings along recess floors of corresponding LED packages.

In one aspect, an LED package comprises: a housing that forms a recess with a recess floor and one or more recess sidewalls; a lead frame structure extending through the housing, wherein a portion of the lead frame structure is arranged along the recess floor; at least one LED chip arranged within the recess and electrically coupled with the lead frame structure; and a light-altering coating arranged on the one or more recess sidewalls, the recess floor, and the portion of the lead frame structure that is arranged along the recess floor. In certain embodiments, the light-altering coating comprises one or more of light-reflective particles and light-absorbing particles suspended in a binder. In certain embodiments, the light-altering coating only partially covers the one or more recess sidewalls. The light-altering coating may cover a range from 25% to 75% of the one or more recess sidewalls. In certain embodiments, the light-altering coating is formed with a non-uniform thickness along the recess floor. In certain embodiments, the light-altering coating forms a curved upper surface that is opposite the recess floor. In certain embodiments, the light-altering coating entirely covers sides of the at least one LED chip. In certain embodiments, the light-altering coating is arranged on the sides of the at least one LED chip at a height above the recess floor that is in range from 50% to 90% of a corresponding height of the at least one LED chip above the recess floor. The LED package may further comprise an encapsulant that is arranged within the recess such that the light-altering coating is between the encapsulant and the recess floor. In certain embodiments, the encapsulant forms a lens shape above the housing. In certain embodiments, the light-altering coating is arranged to only partially cover the recess floor such that an inner edge of the light-altering coating is laterally spaced from the at least one LED chip across the recess floor. In certain embodiments, the inner edge of the light-altering coating is laterally spaced from the at least one LED chip in a range from 10% to 50% of a width of the at least one LED chip. In certain embodiments, a distance between the inner edge of the light-altering material and the at least one LED chip is in a range from 1% to 99% of a distance between the at least one LED chip and an intersection between the recess floor and the one or more recess sidewalls. In certain embodiments, the inner edge of the light-altering coating forms a ring around the at least one LED chip along the recess floor. In certain embodiments, the at least one LED chip is one of a plurality of LED chips arranged within the recess and the inner edge of the light-altering coating is arranged in a linear manner along the recess floor. The LED package may further comprise a retention structure that defines a position of the inner edge of the light-altering coating along the recess floor. In certain embodiments, the retention structure comprises a ridge that is raised above the recess floor or a trench that extends into the recess floor.

In another aspect, an LED package comprises: a housing that forms a recess with a recess floor and one or more recess sidewalls; a lead frame structure extending through the housing, wherein a portion of the lead frame structure is arranged along the recess floor; at least one LED chip arranged within the recess and electrically coupled with the lead frame structure; at least one retention structure arranged along the recess floor; and a light-altering coating that extends across the recess floor from the recess sidewalls to the at least one retention structure. In certain embodiments, the retention structure comprises a ridge that is raised above the recess floor. In certain embodiments, the ridge comprises a same material as the housing. In certain embodiments, the ridge comprises a different material from the housing. In certain embodiments, the ridge comprises a same material as the light-altering coating. In certain embodiments, the ridge extends across portions of the housing and the lead frame structure along the recess floor. In certain embodiments, the retention structure comprises a trench that extends into the recess floor. In certain embodiments, the trench laterally extends through both a portion of the housing and a portion of the lead frame structure along the recess floor. In certain embodiments, the retention structure forms a ring shape around the at least one LED chip along the recess floor. In certain embodiments, the retention structure is arranged in a linear manner along the recess floor.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
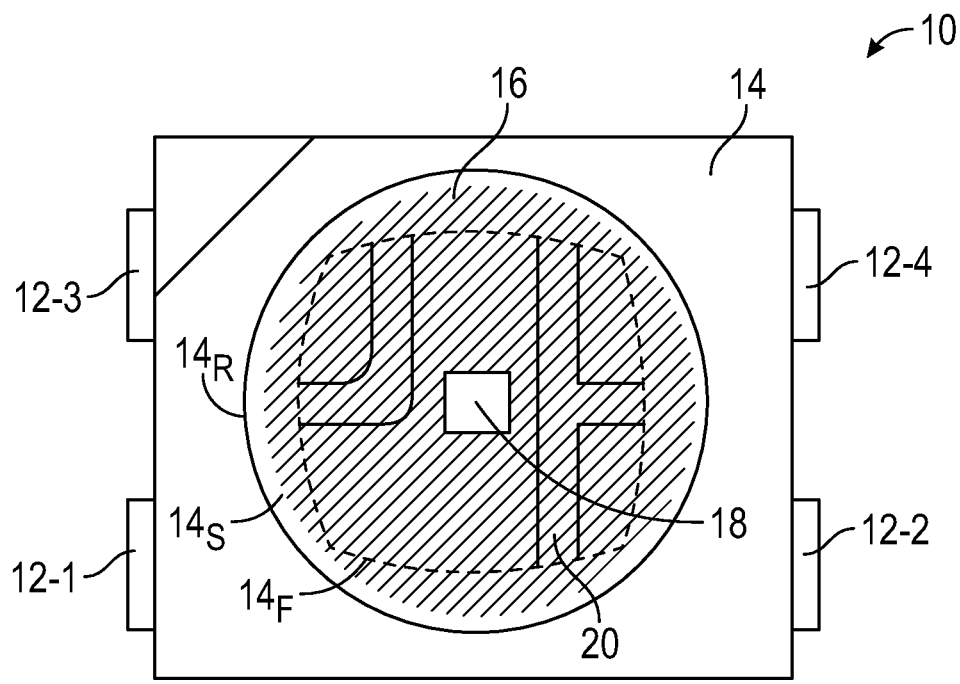
FIG. 1A is a top view of a light-emitting diode (LED) package that includes a lead frame structure, a housing that encases a portion of the lead frame structure, and a light-altering coating that is arranged within a recess formed by the housing.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) packages, and more particularly to arrangements of light-altering coatings in LED packages. Exemplary LED packages may include lead frame structures that are at least partially encased by a housing. Arrangements of light-altering coatings in LED packages may be provided that cover one or more portions of lead frame structures that may be exposed within package recesses. By providing light-altering coatings that cover lead frame structures within package recesses, negative impacts from potential lead frame discoloration due to certain environmental exposure may be reduced. Additionally, such light-altering coatings may be configured to reflect light emissions from LED chips before such light emissions reach portions of lead frame structures. Light-altering coating arrangements are disclosed where light-altering coatings are arranged in contact with LED chips or, alternatively, in a spaced relationship with LED chips. Retention structures are disclosed that may define boundaries of light-altering coatings along recess floors of corresponding LED packages.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 700 nm. In certain embodiments, the active LED structure may be configured to emit light that is outside the visible spectrum, including one or more portions of the ultraviolet (UV) spectrum, or one or more portions of the near infrared spectrum, and/or the infrared spectrum (e.g., 700 nm to 1000 nm). The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a lead frame. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index of refraction that is configured to refract light emissions in a desired direction. In certain aspects, light-reflective particles may also be referred to as light-scattering particles. A weight ratio of the light-reflective particles or scattering particles to a binder may comprise a range of about 0.01:1 to 2:1, or a range of about 0.5:1 to 2:1, or a range of about 1:1 to about 2:1. For light-absorbing materials, the light-altering material may include at least one of carbon, silicon, metal, and organic particles suspended in a binder, such as silicone or epoxy. Such organic particles may include various pigments, dyes, and/or absorptive additives. For embodiments with light-absorbing particles, the weight ratio of the light-absorbing particles to the binder may comprise a range of about 0.01:1 to 1:1, or a range of about 0.01:1 to 0.25:1. Thixotropic materials may include one or more of glass fillers, fumed silica and/or fused silica. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder. As used herein, a layer or coating of one or more light-altering materials may be referred to as a light-altering coating. In certain embodiments, a light-altering material or coating may be devoid of lumiphoric materials.

In certain embodiments, aspects of the present disclosure relate to arrangements of light-altering coatings in LED packages, and more particularly to LED packages with lead frame structures that are at least partially encased by a body or housing. A lead frame structure may typically be formed of a metal, such as copper, copper alloys, or other conductive metals. The lead frame structure may initially be part of a larger metal structure that is singulated during manufacturing of individual LED packages. Within an individual LED package, isolated portions of the lead frame structure may form anode and cathode connections for an LED chip. The body or housing may be formed of an insulating material that is arranged to surround or encase portions of the lead frame structure. The body may be formed on the lead frame structure before singulation so that the individual lead frame portions may be electrically isolated from one another and mechanically supported by the body within an individual LED package. The body may form a cup or a recess in which one or more LED chips may be mounted to the lead frame at a floor of the recess. Portions of the lead frame structure may extend from the recess and through the body to protrude or be accessible outside of the body to provide external electrical connections. An encapsulant material, such as silicone or epoxy, may fill the recess to encapsulate the one or more LED chips.

Arrangements of light-altering coatings in LED packages may be provided that cover one or more portions of lead frame structures that may be exposed within package recesses. While the lead frame structures may typically be formed of a metal that is already reflective to light, such lead frame structures are known to be susceptible to discoloration when exposed to certain environments, such as those that include sulfur. When discolored or tarnished, reflective properties may be diminished, thereby reducing light output. By providing light-altering coatings that cover lead frame portions within package recesses, increased brightness may be obtained, even when lead frame discoloration occurs. Additional arrangements of light-altering coatings may be provided that shape emission profiles of corresponding LED packages.

Figure 1B:
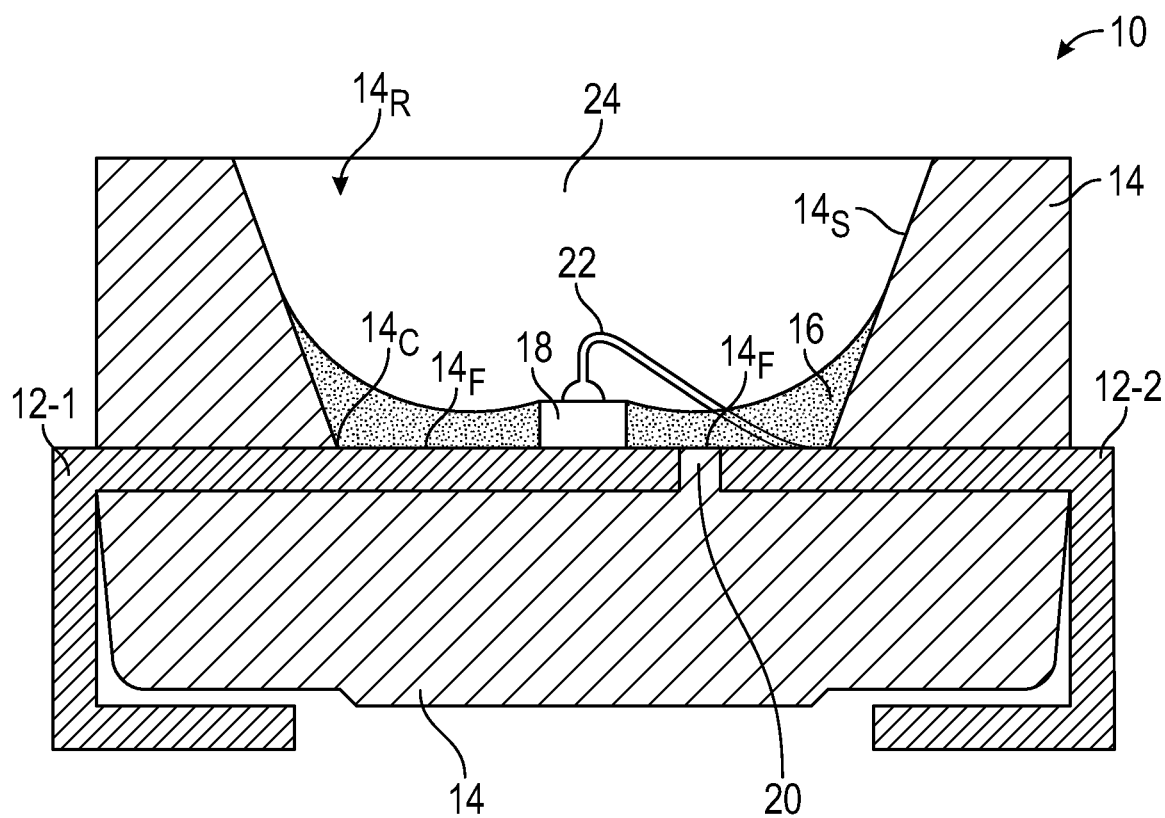
FIG. 1B is a generalized cross-sectional view of the LED package of FIG. 1A.
Figure 1C:
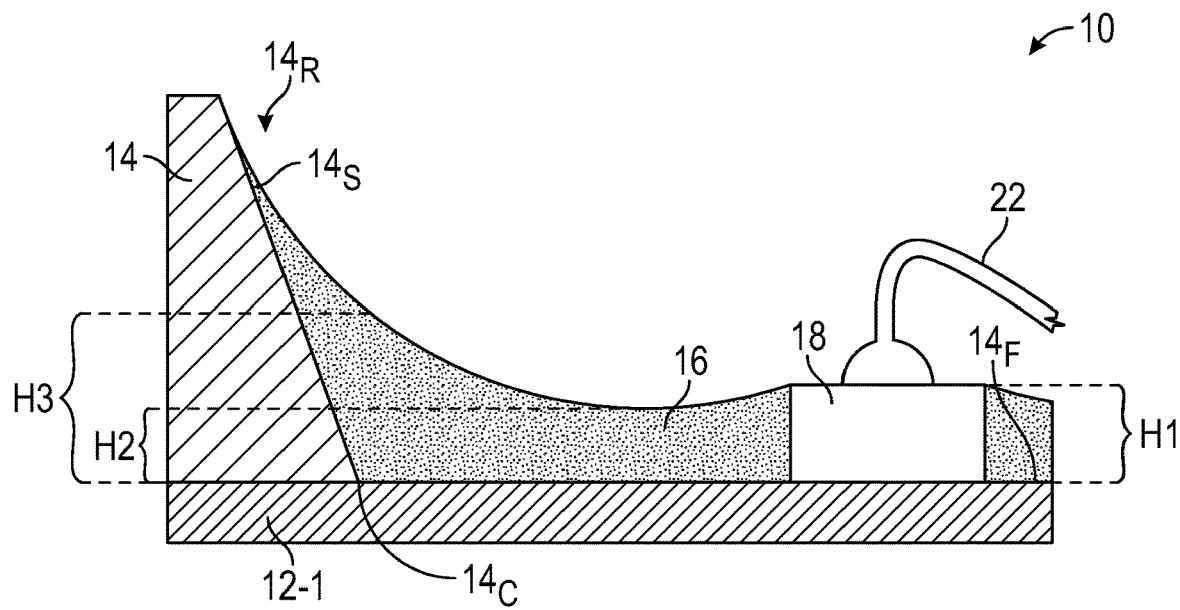
FIG. 1C is an expanded view of a portion of the LED package of FIG. 1B.

FIG. 1A is a top view of an LED package 10 that includes a lead frame structure collectively formed by a plurality of leads 12-1 to 12-4, a body or housing 14 that encases a portion of the lead frame structure, and a light-altering coating 16 that is arranged within a recess $14_R$ that is formed by the housing 14. FIG. 1B is a generalized cross-sectional view of the LED package 10 of FIG. 1A. FIG. 1C is an expanded view of a portion of the LED package 10 of FIG. 1B. For illustrative purposes, the generalized cross-section of FIG. 1B is provided to illustrate the relationship between the leads 12-1, 12-2 of the lead frame structure, an LED chip 18, and the light-altering coating 16. The recess $14_R$ may include a recess floor $14_F$ and one or more recess sidewalls $14_S$. The leads 12-1 to 12-4 may be arranged to extend through the housing 14 and a portion of the leads 12-1 to 12-4 may be arranged along or otherwise exposed at the recess floor $14_F$. A gap 20 may be arranged between the leads 12-1, 12-2 that is filled with portions of the housing 14 to provide electrical isolation. In certain embodiments, surfaces of the leads 12-1, 12-2 may be coplanar with surfaces of the housing 14 along the recess floor $14_F$. As illustrated, the LED chip 18 may be mounted within the recess $14_R$ and electrically coupled to the leads 12-1, 12-2 at the recess floor $14_F$. In certain embodiments, the LED chip 18 may be mounted on and electrically coupled to the lead 12-1 and a wire bond 22 may be arranged to electrically couple the LED chip 18 to the lead 12-2. While a single wire bond 22 is illustrated, it is understood that the LED chip 18 may embody a lateral structure where a second wire bond may be employed to provide electrical coupling with the lead 12-1. As illustrated, at least a portion of the wire bond 22 may be configured to extend through the light-altering coating 16. In other embodiments, the LED chip 18 may be configured for flip-chip mounting such that the LED chip 18 is mounted to bridge the gap 20 and be electrically coupled to the leads 12-1, 12-2 without the wire bond 22.

As best illustrated in FIG. 1B, the light-altering coating 16 may be arranged on the one or more recess sidewalls $14_S$, the recess floor $14_F$, and portion of the leads 12-1 to 12-4 that are arranged along the recess floor $14_F$. Depending on the application, the light-altering coating 16 may include any of the light-altering materials described above, such as light-reflective materials, light-absorbing materials, and/or thixotropic materials. In certain embodiments when the light-altering coating 16 is primarily light-reflective, the light-altering coating 16 may be referred to as a light-reflective coating. In certain embodiments when the light-altering coating 16 is primarily light-absorbing, the light-altering coating 16 may be referred to as a light-absorbing coating. In still further embodiments, the light-altering coating 16 may include both light-reflective and light-absorbing materials to provide increased light output while also providing increased contrast. An encapsulant 24, such as silicone or epoxy, may fill the recess $14_R$ to provide encapsulation for the LED chip 18. As illustrated, the light-altering coating 16 may be arranged between the encapsulant 24 and one or more of the housing 14 and the leads 12-1 to 12-4.

The light-altering coating 16 may be dispensed within the recess $14_R$ and around the LED chip 18. In certain embodiments, the light-altering coating 16 may be allowed to settle within the recess $14_R$ for a time period at an elevated temperature, but below a curing temperature for the light-altering coating 16. After settling, the light-altering coating 16 may be cured. The curing may involve a full cure of the light-altering coating 16 before the encapsulant 24 is cured, a partial cure of the light-altering coating 16 followed by full curing with the encapsulant 24, or single-step full curing for both the light-altering coating 16 and the encapsulant 24.

In certain embodiments, the dispensing, settling, and curing sequence may encourage removal of air bubbles from the light-altering coating 16 and may also control the shape of the light-altering coating 16. For example, in FIG. 1B, the light-altering coating 16 is arranged to cover the entire recess floor $14_F$ outside of the LED chip 18 and only partially cover the recess sidewalls $14_S$. For partial coverage of the recess sidewalls $14_S$, the light-altering coating 16 may be arranged to cover a range of 5% to 75%, or a range from 25% to 75%, or a range from 25% to 50% of the recess sidewalls $14_S$. In certain embodiments, the light-altering coating 16 may directly contact sides of the LED chip 18. Additionally, the light-altering coating 16 may be formed with a non-uniform thickness or height above the recess floor $14_F$ from the LED chip 18 to the recess sidewalls $14_S$. For example, a first height H1 of the light-altering coating 16 at the LED chip 18 may be greater than a second height H2 of the light-altering coating 16 between the LED chip 18 and the recess sidewalls $14_S$. In certain embodiments, a third height H3 of the light-altering coating 16 that is proximate the recess sidewalls $14_S$ may also be greater than the second height H2. In some instances, the third height H3 may also be greater than the first height H1. In this manner, the light-altering coating 16 may be arranged to form a curved upper surface opposite the recess floor $14_F$ to redirect light from the LED chip 18 out of the LED package 10 with increased efficiency.

By only partially covering the recess sidewalls $14_S$, laterally emitted light from the LED chip 18 may also be redirected by portions of the housing 14 at the top of the recess sidewalls $14_S$ such that an overall emission viewing angle for the LED package 10 may not be significantly impacted by the presence of the light-altering coating 16. In this regard, the third height H3 of the light-altering coating 16 may be tailored based on desired emission patterns, whereby higher values for the third height H3 may cover more of the recess sidewalls $14_S$ and provide narrower emission patterns. In certain embodiments, partially covering the recess sidewalls $14_S$ may serve to improve integrity of the LED package 10 by providing increased adhesion between the encapsulant 24 and the housing 14 along the recess sidewalls $14_S$. Additionally, the presence of the light-altering coating 16 at recess corners $14_C$ that are formed between the recess sidewalls $14_S$ and the recess floor $14_F$ may further improve integrity of the LED package 10. For example, thermal stress and/or expansion during operation could potentially lead to delamination of the encapsulant 24 at such recess corners $14_C$. By providing the light-altering coating 16 at the recess corners $14_C$, such failure mechanisms may be reduced, particularly when the light-altering coating 16 forms a curved shape that serves to smooth out a profile of the encapsulant 24 that is near the recess corners $14_C$.

Figure 1D:
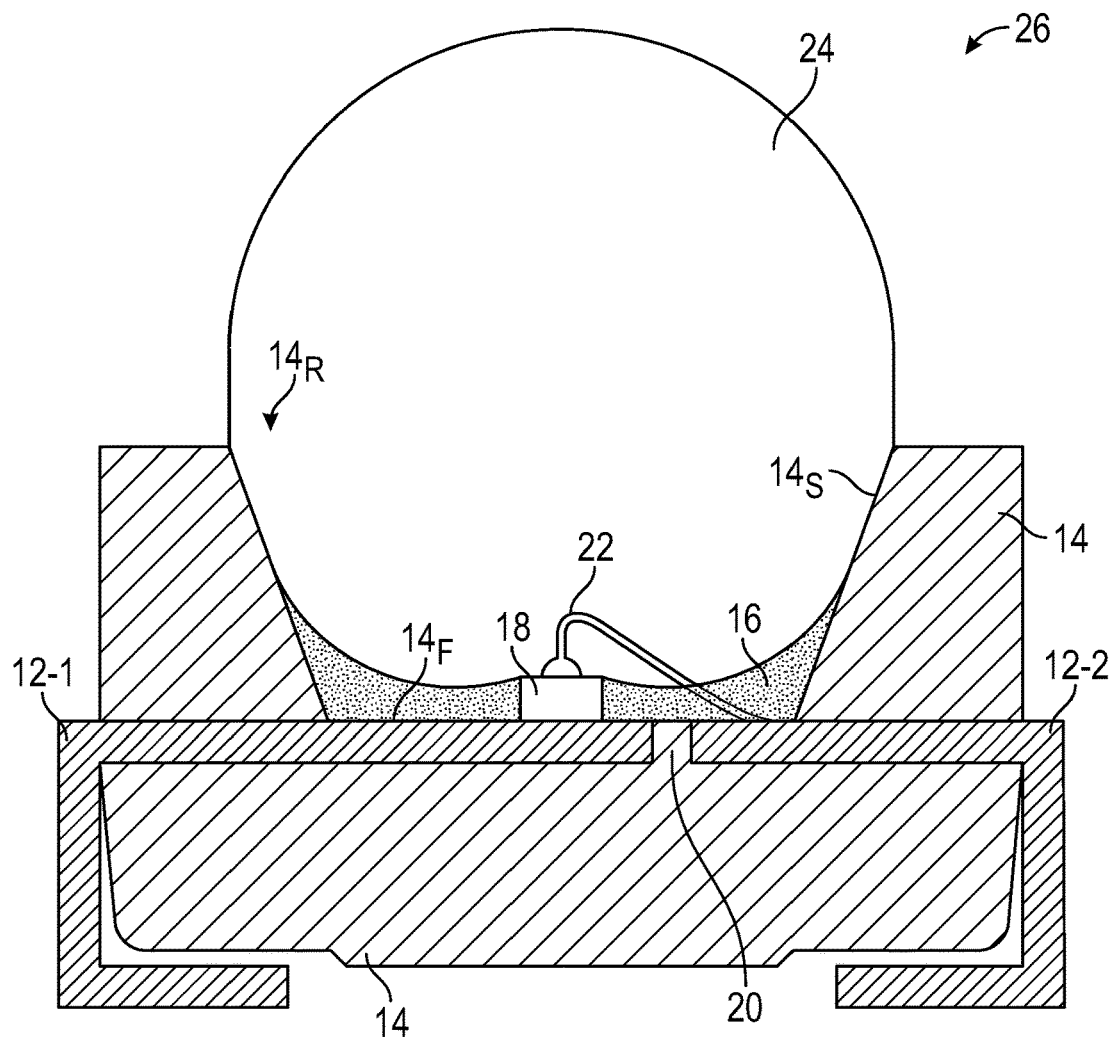
FIG. 1D is a generalized cross-sectional view of an LED package that is the same as the LED package of FIG. 1B, except that the encapsulant forms a nonplanar shape above the housing.

FIG. 1D is a generalized cross-sectional view of an LED package 26 that is the same as the LED package 10 of FIG. 1B, except that the encapsulant 24 forms a nonplanar shape above the housing 14. In this manner, the encapsulant 24 may form a lens that further shapes an emission profile of the LED package 26. Many different materials can be used for the encapsulant 24, including silicones, plastics, epoxies or glass, with a suitable material being compatible with molding processes. Silicone is suitable for molding and provides optical transmission properties for light emitted from the LED chip 18. In certain embodiments, the encapsulant 24 can be molded into the shape of the lens. Different molding techniques may provide many different shapes depending on the desired emission pattern for the LED package 26. One suitable shape includes a curved or hemispheric top surface, with some alternative examples being ellipsoid bullet, flat, hex-shaped and square. In certain embodiments, a suitable shape includes both curved and planar surfaces, such as a hemispheric top portion with planar side surfaces.

Figure 1E:
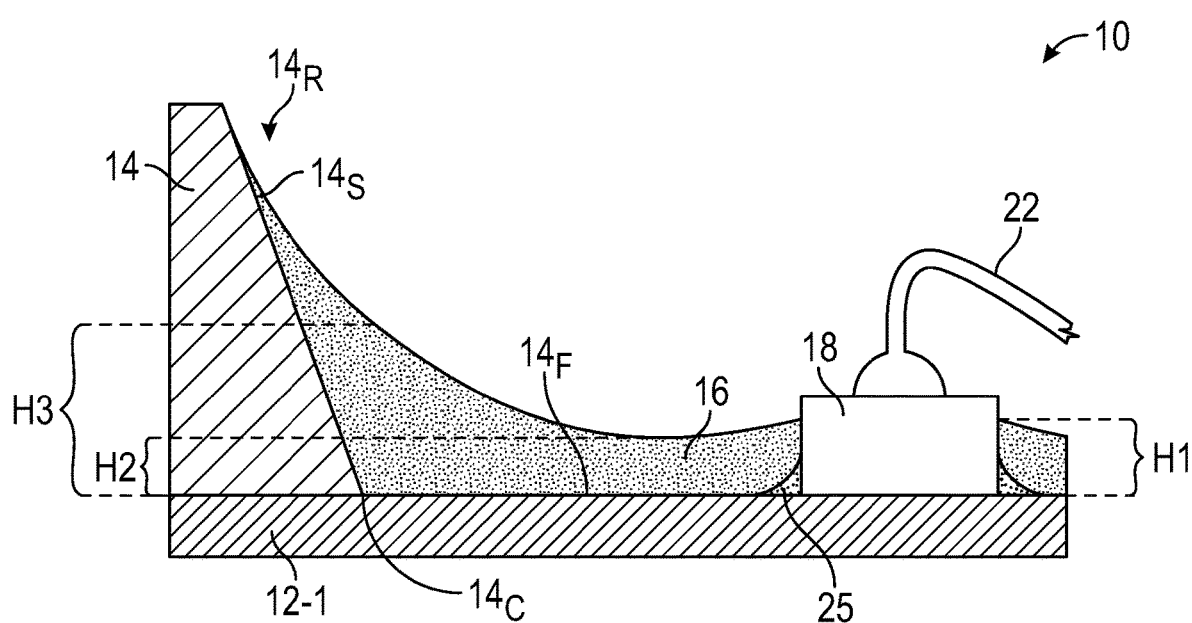
FIG. 1E is an expanded view of a portion of an LED package that is similar to FIG. 1C and illustrates an alternative arrangement of the light-altering material.

FIG. 1E is an expanded view of a portion of an LED package 10 that is similar to FIG. 1C and illustrates an alternative arrangement of the light-altering coating 16. While FIG. 1C illustrates an arrangement where the light-altering coating 16 entirely covers sides or peripheral edges of the LED chip 18, the principles disclosed may also provide arrangements where the light-altering coating 16 only partially covers sides or peripheral edges of the LED chip 18. As illustrated in FIG. 1E, the light-altering coating 16 only covers a portion of the edges of the LED chip 18. For example, the first height H1 of the light-altering coating 16 at the LED chip 18 as measured from the recess floor $14_F$ may be provided in a range from 50% to 90%, or in a range from 50% to 75% of a height of a top surface of the LED chip 18. In certain embodiments, a fillet 25 may be arranged proximate the LED chip 18 and the recess floor $14_F$. The fillet 25, when present, may comprise bonding materials that bond the LED chip 18 along the recess floor $14_F$ and to the lead 12-1. The fillet 25 may comprise silicone or epoxy materials, and in some embodiments, the fillet 25 may comprise similar materials as the light-altering coating 16. The fillet 25 as illustrated in FIG. 1E may be present in any of the other embodiments and figures of the present disclosure.

In certain embodiments, LED packages may include arrangements of light-altering coatings in housing recesses such that the light-altering coatings cover recess floors without extending all the way to an LED chip. In this manner, a portion of a recess floor that is adjacent the LED chip may be devoid of or uncovered by light-altering coatings. Such configurations may avoid interference between the light-altering coatings and bonding materials for the LED chip that could otherwise degrade mechanical bonding of the LED chip.

Figure 2A:
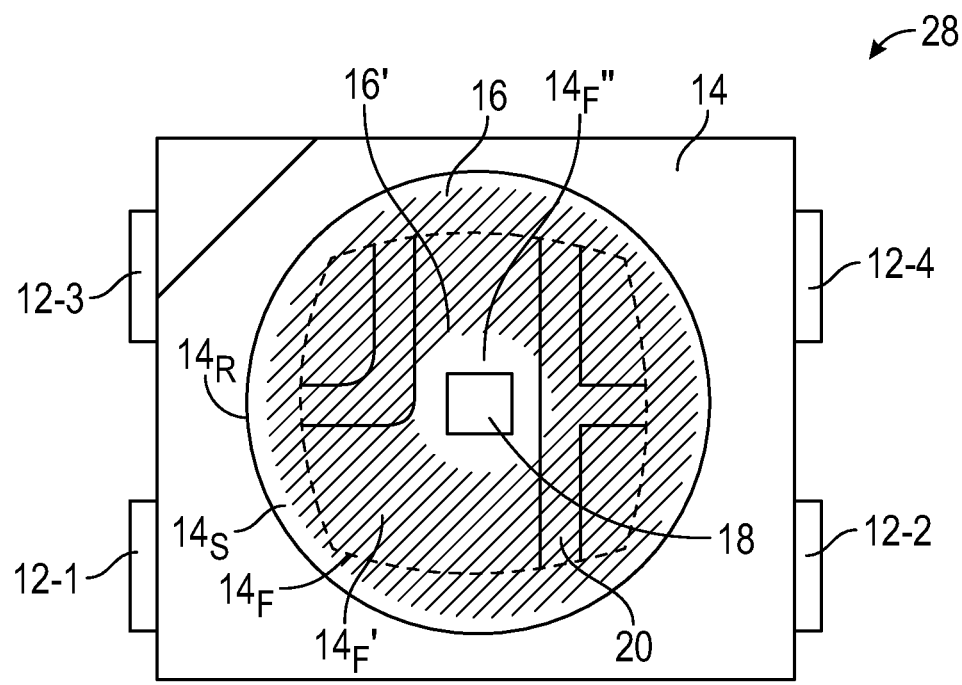
FIG. 2A is a top view of an LED package that is similar to the LED package of FIG. 1A, but where the light-altering coating covers the recess floor without extending entirely to the LED chip.
Figure 2B:
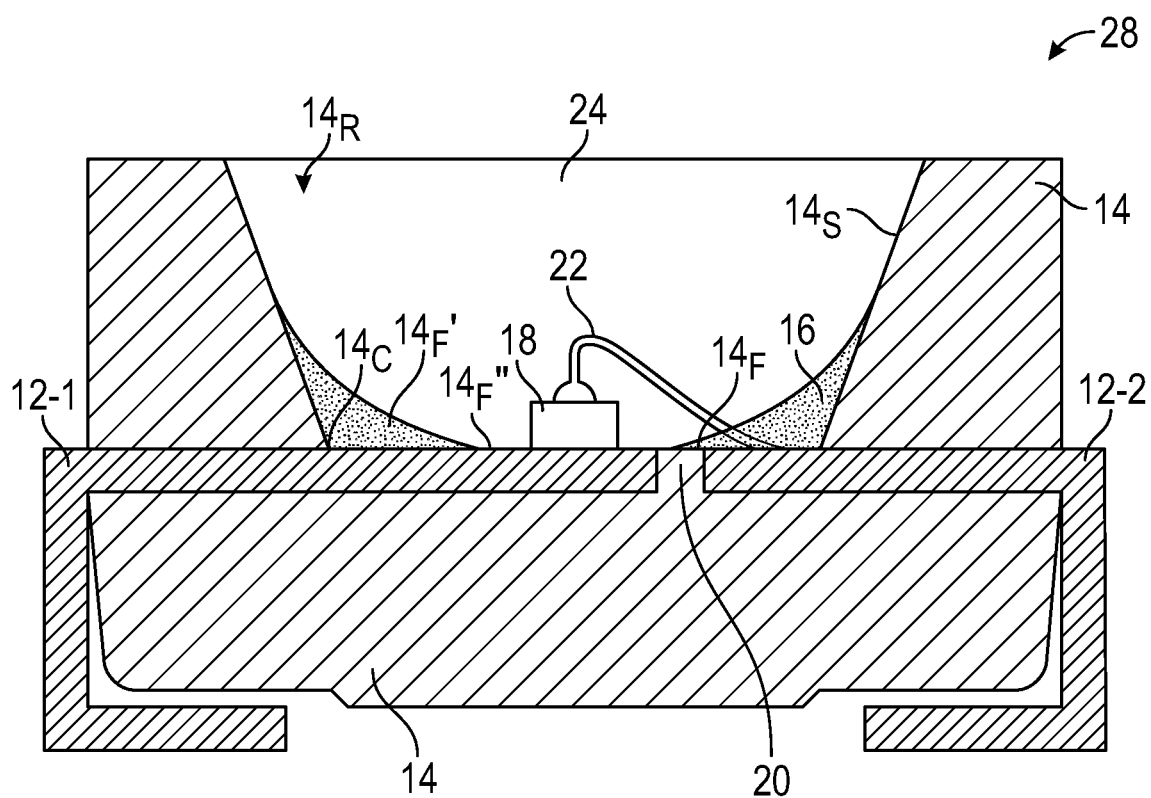
FIG. 2B is a generalized cross-sectional view of the LED package of FIG. 2A.
Figure 2C:
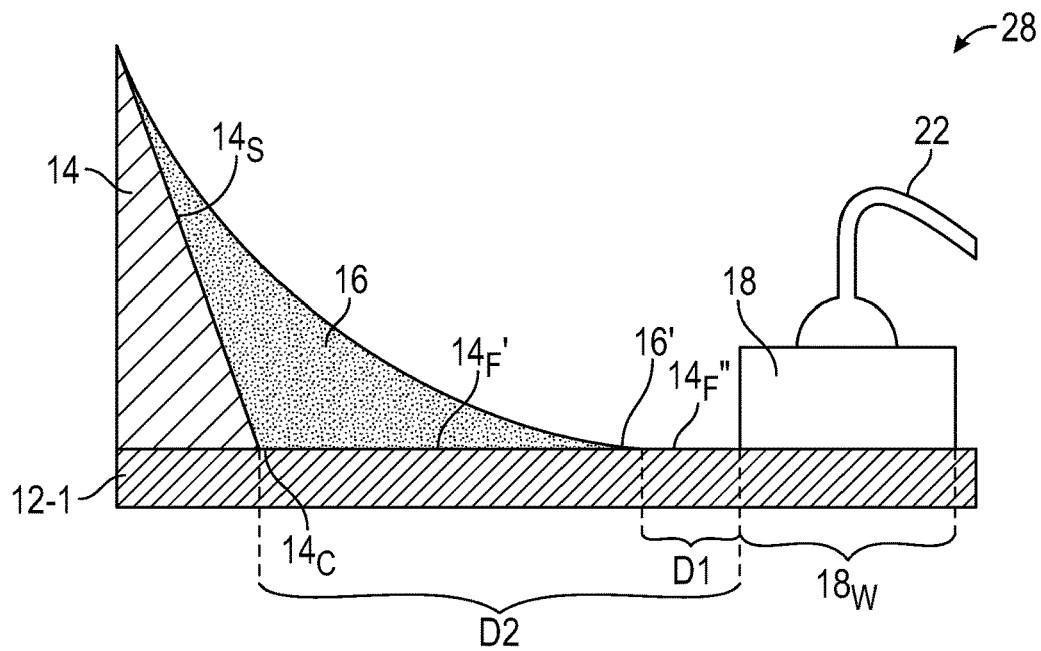
FIG. 2C is an expanded view of a portion of the LED package of FIG. 2B.

FIG. 2A is a top view of an LED package 28 that is similar to the LED package 10 of FIG. 1A, but where the light-altering coating 16 covers the recess floor $14_F$ without extending entirely to the LED chip 18. FIG. 2B is a generalized cross-sectional view of the LED package 28 of FIG. 2A. FIG. 2C is an expanded view of a portion of the LED package 28 of FIG. 2B. For illustrative purposes, the generalized cross-section of FIG. 2B is provided to illustrate the relationship between the leads 12-1, 12-2 of the lead frame structure, the LED chip 18, and the light-altering coating 16. As illustrated, a first portion $14_F'$ of the recess floor $14_F$ may be covered with the light-altering coating 16, and a second portion $14_F''$ of the recess floor $14_F$ may be devoid of or otherwise uncovered by the light-altering coating 16. In this manner, the light-altering coating 16 may be formed with a clearance from the LED chip 18 to avoid interactions between the light-altering coating 16 and bonding materials for the LED chip 18. Additionally, the light-altering coating 16 may be discouraged from wicking between portions of the LED chip 18 and the recess floor $14_F$, which could otherwise promote delamination of the LED chip 18 during operation. In certain embodiments, an inner edge 16' of the light-altering coating 16 may form a ring shape, such as a circle, oval, square, or rectangle shaped ring, among others around the LED chip 18 along the recess floor $14_F$. As with previous embodiments, the light-altering coating 16 may partially cover or entirely cover the recess sidewalls $14_S$, depending on the embodiment. For partial coverage of the recess sidewalls $14_S$, the light-altering coating 16 may be arranged to cover a range of 5% to 75%, or a range from 25% to 75%, or a range from 25% to 50% of the recess sidewalls $14_S$.

As best illustrated in FIG. 2C, the inner edge 16' of the light-altering coating 16 may be laterally spaced from a side of the LED chip 18 by a distance D1. In certain embodiments, the distance D1 is such that the light-altering coating 16 is positioned as close as possible to the LED chip 18 without extending entirely to the LED chip 18. For example, the distance D1 may be in a range that is from about 10% to about 50%, or in a range from about 25% to about 50% of a length or width $18_W$ of the LED chip 18 as measured along the recess floor $14_F$. In this regard, the light-altering coating 16 may cover as much of the lead frame structure as possible while also avoiding possible reductions in bonding integrity of the LED chip 18. In other embodiments, the distance D1 may be quantified as a percentage of a distance D2 as measured from a side of the LED chip 18 to the intersection between the recess floor $14_F$ and the recess sidewall $14_S$. In this regard, for embodiments where the light-altering coating 16 extends on the recess floor $14_F$ to be proximate the LED chip 18, the distance D1 may be in a range from 1% to 25%, or in a range from 1% to 10% of the distance D2. In other embodiments, the distance D1 may be in a range from 1% to 99% of the distance D2 without deviating from the principles disclosed.

Figure 2D:
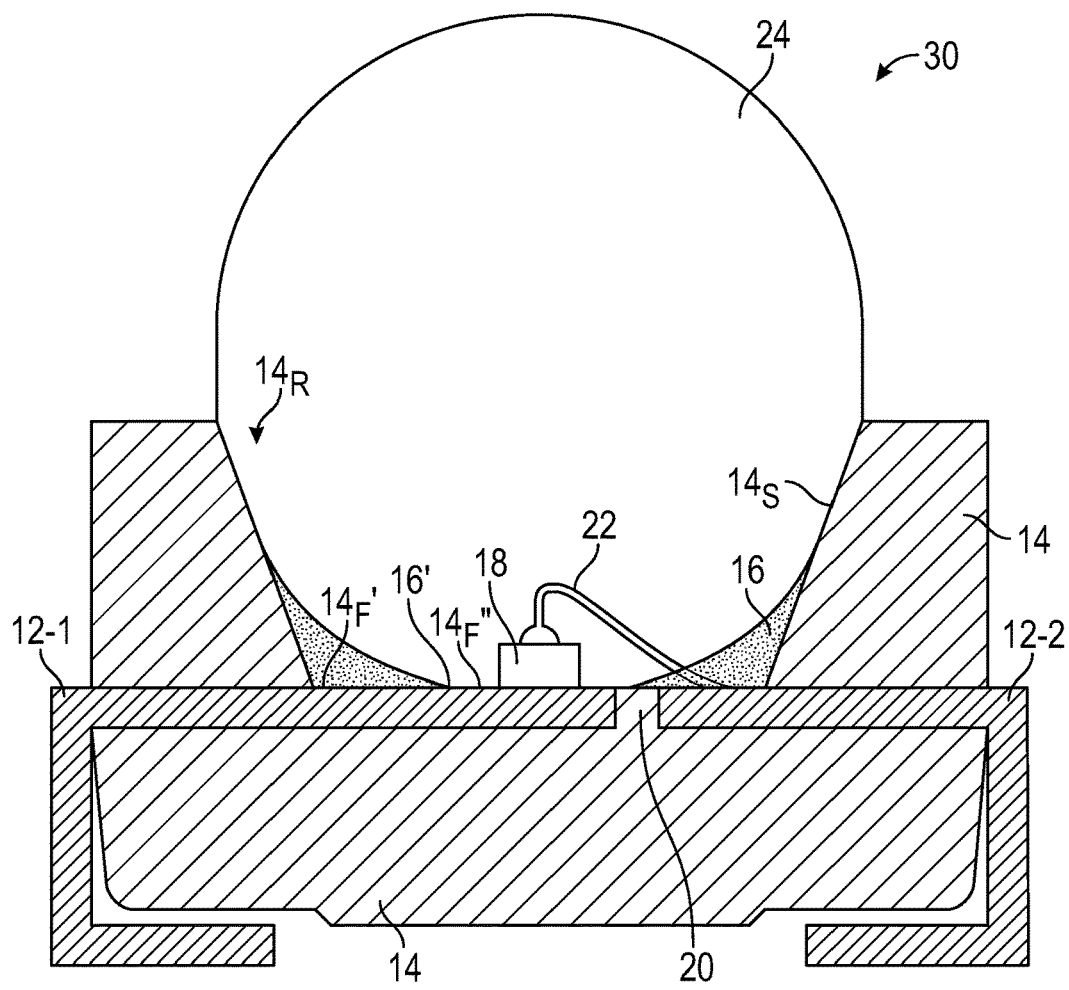
FIG. 2D is a generalized cross-sectional view of an LED package that is the same as the LED package of FIG. 2B, except that the encapsulant forms a nonplanar shape above the housing.

FIG. 2D is a generalized cross-sectional view of an LED package 30 that is the same as the LED package 28 of FIG. 2B, except that the encapsulant 24 forms a nonplanar shape above the housing 14. In this manner, the encapsulant 24 may form a lens that further shapes an emission profile of the LED package 30. The shape of the lens may form any of the shapes previously described above for FIG. 1D.

Figure 3A:
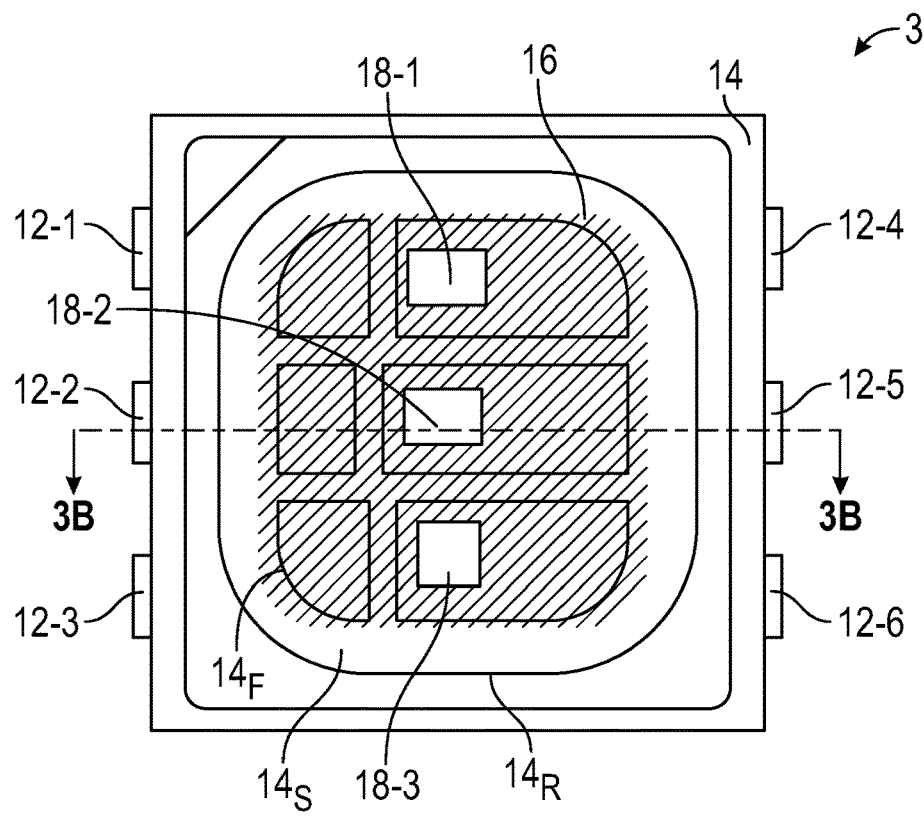
FIG. 3A is a top view of an LED package that is similar to the LED package of FIG. 1A, but where the LED package includes a plurality of LED chips.
Figure 3B:
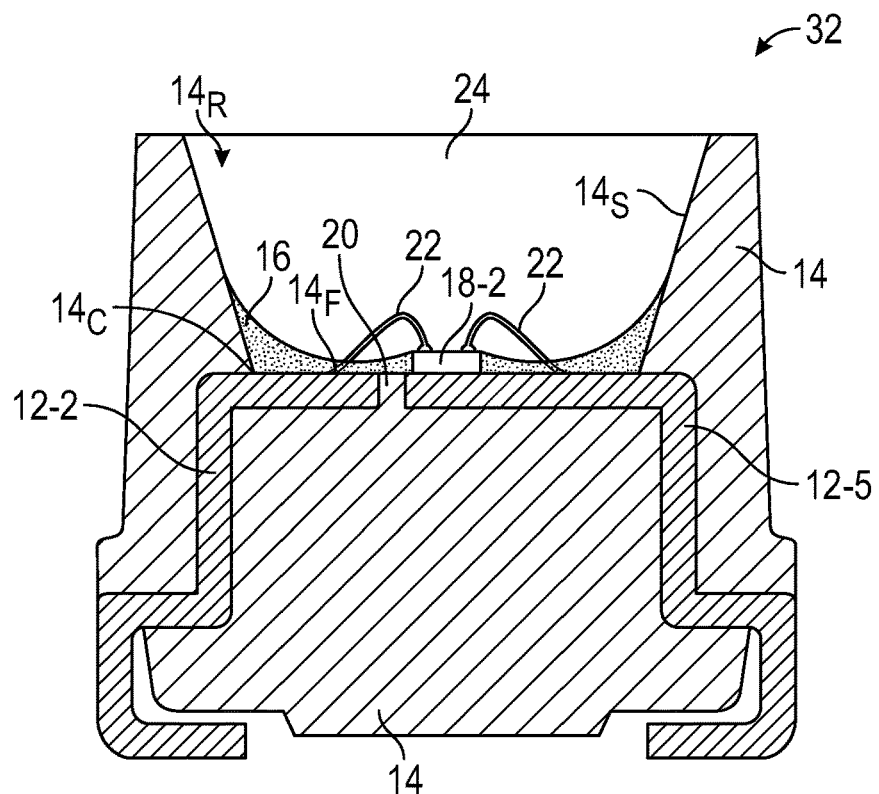
FIG. 3B is a cross-sectional view of the LED package of FIG. 3A taken along the section line 3B-3B of FIG. 3A.

FIG. 3A is a top view of an LED package 32 that is similar to the LED package 10 of FIG. 1A, but where the LED package 32 includes a plurality of LED chips 18-1 to 18-3 and a plurality of leads 12-1 to 12-6. FIG. 3B is a cross-sectional view of the LED package 32 of FIG. 3A taken along the section line 3B-3B of FIG. 3A. In certain embodiments, the lead frame structure may include individual pairs of the leads 12-1 to 12-6 for each individual one of the LED chips 18-1 to 18-3 while in other embodiments, at least one of the leads 12-1 to 12-6 may be shared among several of the LED chips 18-1 to 18-3. In a similar manner to FIG. 1A, the light-altering coating 16 may be arranged on the one or more recess sidewalls $14_S$, the recess floor $14_F$, and portions of the leads 12-1 to 12-6 that are arranged along the recess floor $14_F$. In certain embodiments, the light-altering coating 16 is arranged to cover the entire recess floor $14_F$ outside of the LED chips 18-1 to 18-3 and only partially cover the recess sidewalls $14_S$. In this manner, the light-altering coating 16 may directly contact sides of each of the LED chips 18-1 to 18-3. Additionally, the light-altering coating 16 may be formed with a non-uniform thickness from each of the LED chips 18-1 to 18-3 to the recess sidewalls $14_S$.

Figure 4A:
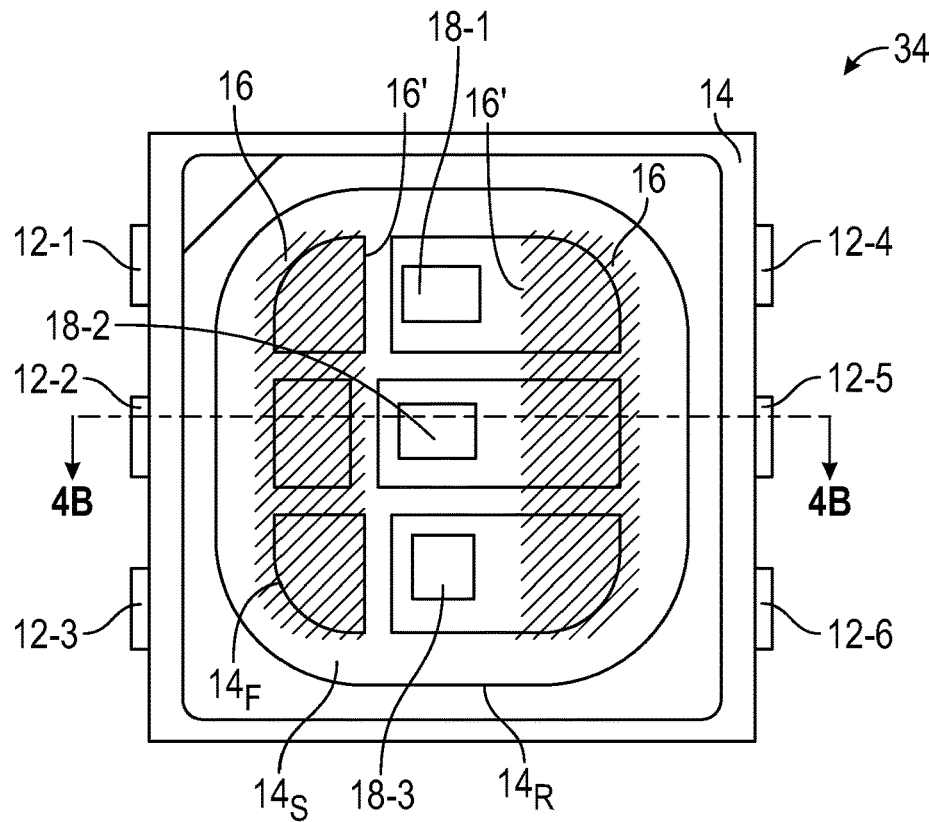
FIG. 4A is a top view of an LED package that is similar to the LED package of FIG. 2A, but where the LED package includes a plurality of LED chips.
Figure 4B:
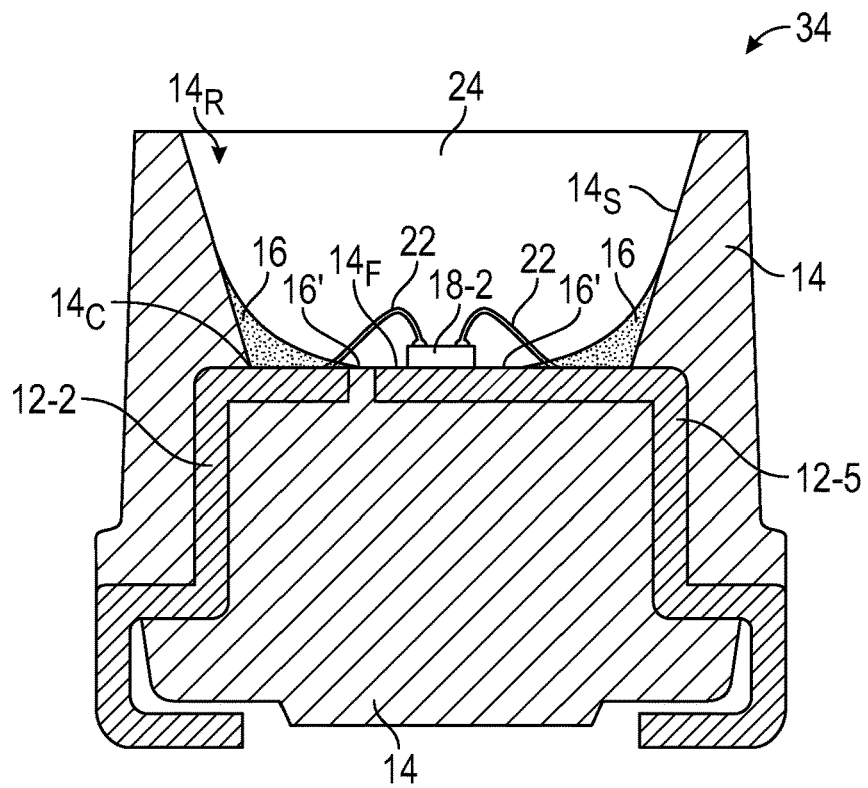
FIG. 4B is a cross-sectional view of the LED package of FIG. 4A taken along the section line 4B-4B of FIG. 4A.

FIG. 4A is a top view of an LED package 34 that is similar to the LED package 28 of FIG. 2A, but where the LED package 34 includes a plurality of LED chips 18-1 to 18-3 and a plurality of leads 12-1 to 12-6. FIG. 4B is a cross-sectional view of the LED package 34 of FIG. 4A taken along the section line 4B-4B of FIG. 4A. In a similar manner to FIG. 2A, the light-altering coating 16 covers the recess floor 14$_F$ without extending entirely to the LED chips 18-1 to 18-3. In certain embodiments, inner edges 16' of the light-altering coating 16 define lateral separation between the light-altering coating 16 and the LED chips 18-1 to 18-3 along the recess floor 14$_F$. In certain embodiments, the inner edges 16' may be formed in a linear manner on opposing sides of the LED chips 18-1 to 18-3. In a similar manner as illustrated for FIG. 2C, the inner edges 16' may be spaced from the LED chips 18-1 to 18-3 in a range that is from about 10% to about 50%, or in a range from about 25% to about 50% of a length or width 18$_W$ of individual ones of the LED chips 18-1 to 18-3 as measured along the recess floor 14$_F$. In certain embodiments, the inner edges 16' may be spaced from the LED chips 18-1 to 18-3 in a range from 1% to 99%, or in a range from 1% to 25%, or in a range from 1% to 10% of a distance between the LED chips 18-1 to 18-3 and an intersection between the recess floor 14$_F$ and the recess sidewalls 14$_S$. As with previous embodiments, the light-altering coating 16 may also be arranged to partially extend along or otherwise cover only portions of the recess sidewalls 14$_S$ as described above for FIG. 1B.

In certain embodiments, LED packages may include retention structures that are positioned at the recess floors for controlling positions of the light-altering coatings. The retention structures may include one or more ridges that extend above the recess floor to serve as a dam during application of the light-altering coating. In certain embodiments, the ridges may be integral with the housing such that the ridges are formed as the housing is molded or otherwise formed on the lead frame structure. Alternatively, the ridges may be a separate structure that is provided on the recess floor after the housing has been formed. In other embodiments, retention structures may include one or more trenches that extend into or below the recess floor to serve as a stopping position during application of the light-altering coating. For example, the trenches may be formed in one or more of the housing and the lead frame structure. In certain embodiments, a trench may be formed in both the housing and the lead frame structure at the recess floor.

Figure 5A:
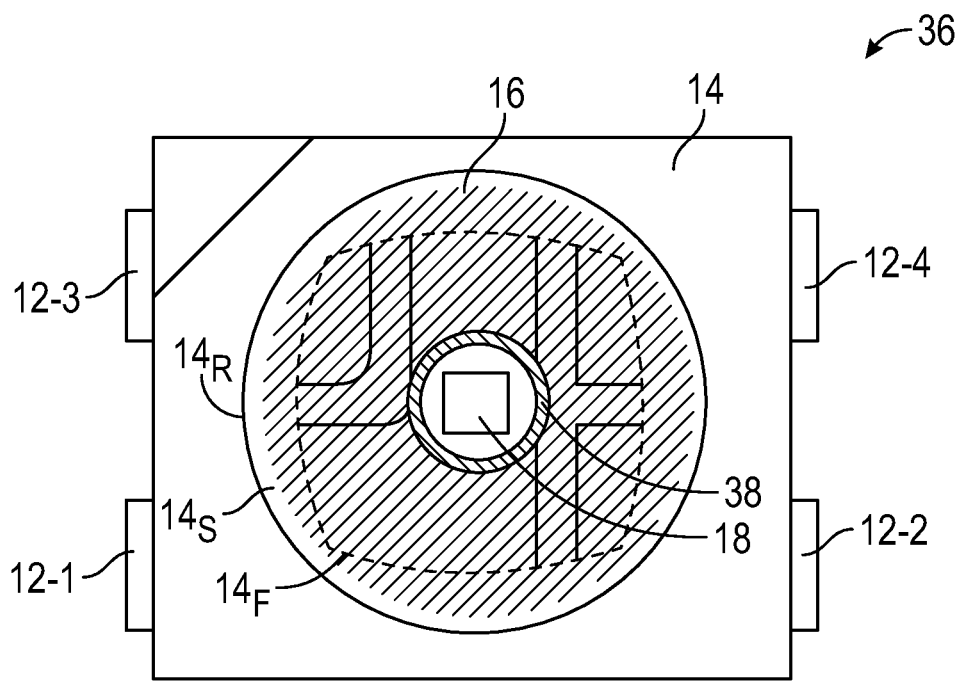
FIG. 5A is a top view of an LED package that is similar to the LED package of FIG. 2A, but where the LED package includes a retention structure in the form of a ridge that extends above the recess floor to define a boundary of the light-altering coating.
Figure 5B:
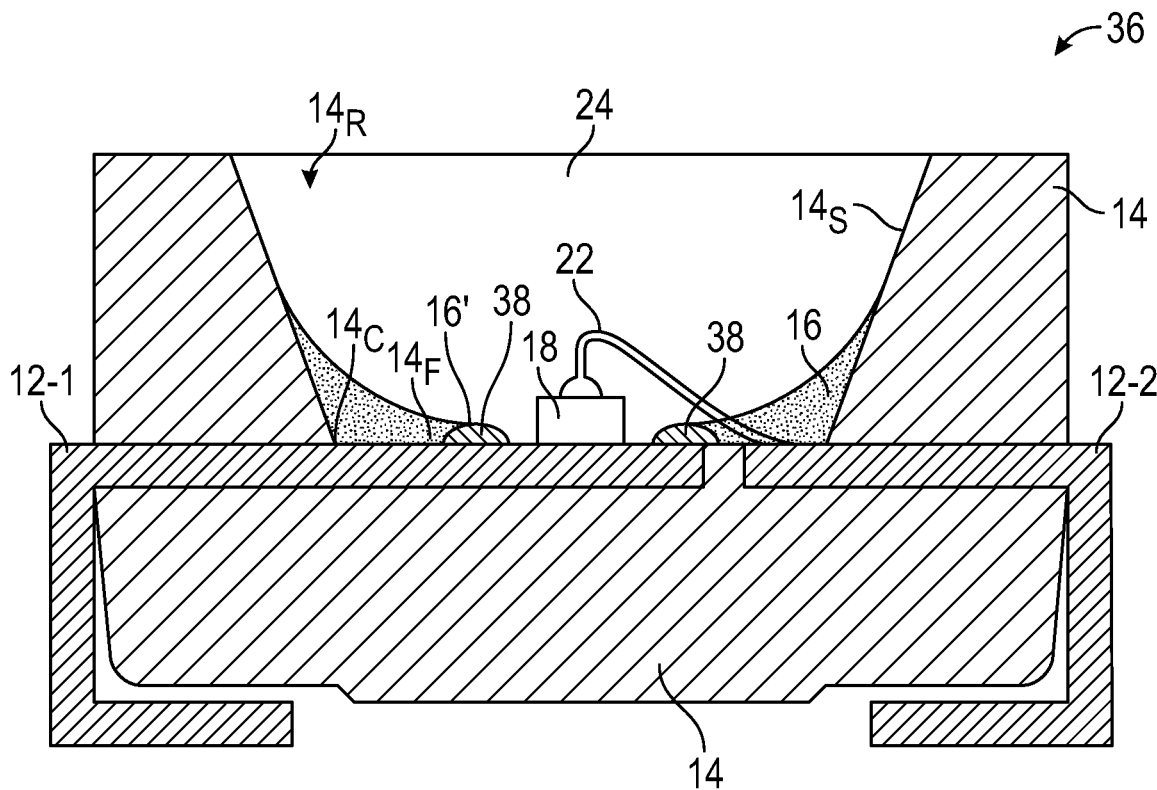
FIG. 5B is a generalized cross-sectional view of the LED package of FIG. 5A.
Figure 5C:
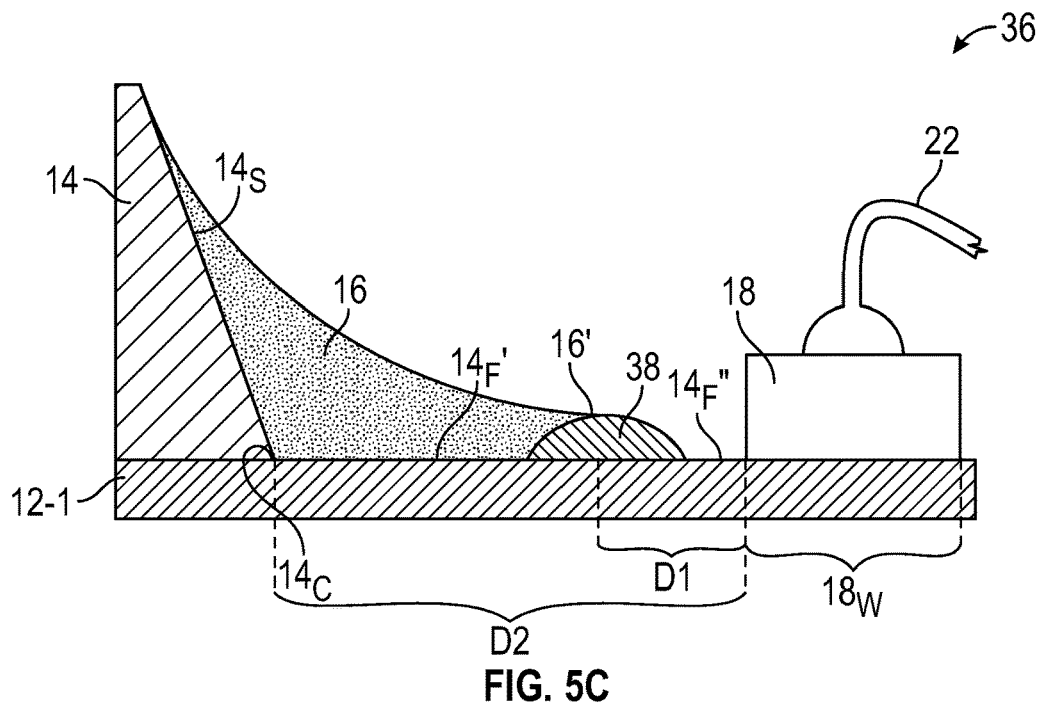
FIG. 5C is an expanded view of a portion of the LED package of FIG. 5B.

FIG. 5A is a top view of an LED package 36 that is similar to the LED package 28 of FIG. 2A, but where the LED package 36 includes a retention structure in the form of a ridge 38 that extends above the recess floor 14$_F$ to define a boundary of the light-altering coating 16. FIG. 5B is a generalized cross-sectional view of the LED package 36 of FIG. 5A. FIG. 5C is an expanded view of a portion of the LED package 36 of FIG. 5B. For illustrative purposes, the generalized cross-section of FIG. 5B is provided to illustrate the relationship between the leads 12-1, 12-2 of the lead frame structure, the LED chip 18, the light-altering coating 16, and the ridge 38. By extending above the recess floor 14$_F$, the ridge 38 may form a dam that retains the light-altering coating 16 to certain portions of the recess 14$_R$. In this manner, the inner edge 16' of the light-altering coating 16 may reside on or otherwise be registered at the ridge 38. As illustrated in FIG. 5A, the ridge 38 may form a ring shape, such as a circle, oval, square, or rectangle shaped ring, among others around the LED chip 18 along the recess floor 14$_F$. While a circle is shown, other shapes, such as a square, rectangle, among others, may also be implemented. In certain embodiments, the ridge 38 may extend over portions of both the leads 12-1, 12-2 of the lead frame structure and over portions of the housing 14 that are positioned at the recess floor 14$_F$.

In certain embodiments, the ridge 38 comprises a same material of the housing 14 such that the ridge 38 is an extension of the housing 14. In this regard, the ridge 38 may be formed concurrently with the housing 14, such as by a molding process of the housing 14 around the leads 12-1 to 12-2. In other embodiments, the ridge 38 may comprise a different material than the housing 14 such that the ridge 38 is formed after the housing 14 is provided around the leads 12-1 to 12-2. In certain embodiments, the ridge 38 may comprise a same material as the light-altering coating 16. In this regard, the ridge 38 may be first deposited and at least partially cured to form the boundary of the light-altering coating 16. As illustrated in FIG. 5C, the ridge 38 may be arranged to position the inner edge 16' of the light-altering coating 16 a distance D1 from the LED chip 18 that is in a range from about 10% to about 50%, or in a range from about 25% to about 50% of a length or width 18$_W$ of the LED chip 18 as measured along the recess floor 14$_F$. In other embodiments, the distance D1 may be quantified as a percentage of a distance D2 as measured from a side of the LED chip 18 to the intersection of between the recess floor 14$_F$ and the recess sidewall 14$_S$. In this regard, for embodiments where the light-altering coating 16 extends on the recess floor 14$_F$ to be proximate the LED chip 18, the distance D1 may be in a range from 1% to 25%, or in a range from 1% to 10% of the distance D2. In other embodiments, the distance D1 may be in a range from 1% to 99% of the distance D2 without deviating from the principles disclosed. As with previous embodiments, the light-altering coating 16 may also be arranged to partially extend along or otherwise cover only portions of the recess sidewalls 14$_S$ as described above for FIG. 1B.

Figure 5D:
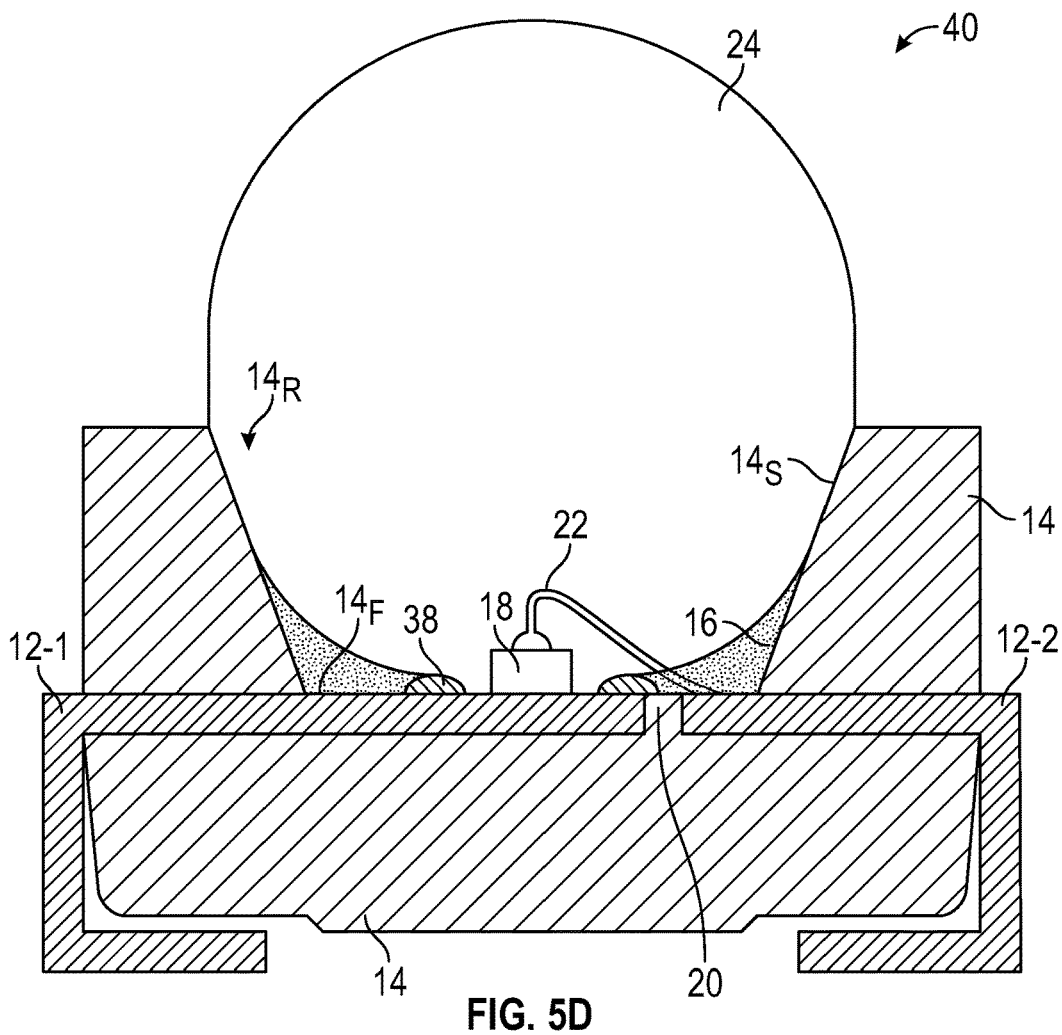
FIG. 5D is a generalized cross-sectional view of an LED package that is the same as the LED package of FIG. 5B, except that the encapsulant forms a nonplanar shape above the housing.

FIG. 5D is a generalized cross-sectional view of an LED package 40 that is the same as the LED package 36 of FIG. 5B, except that the encapsulant 24 forms a nonplanar shape above the housing 14. In this manner, the encapsulant 24 may form a lens that further shapes an emission profile of the LED package 40 in a similar manner as described above for FIG. 1D. For example, the lens may include a shape with a curved or hemispheric top surface, with alternative shapes including ellipsoid bullet, flat, hex-shaped and square. In certain embodiments, a suitable shape includes both curved and planar surfaces, such as a hemispheric top portion with planar side surfaces.

Figure 6A:
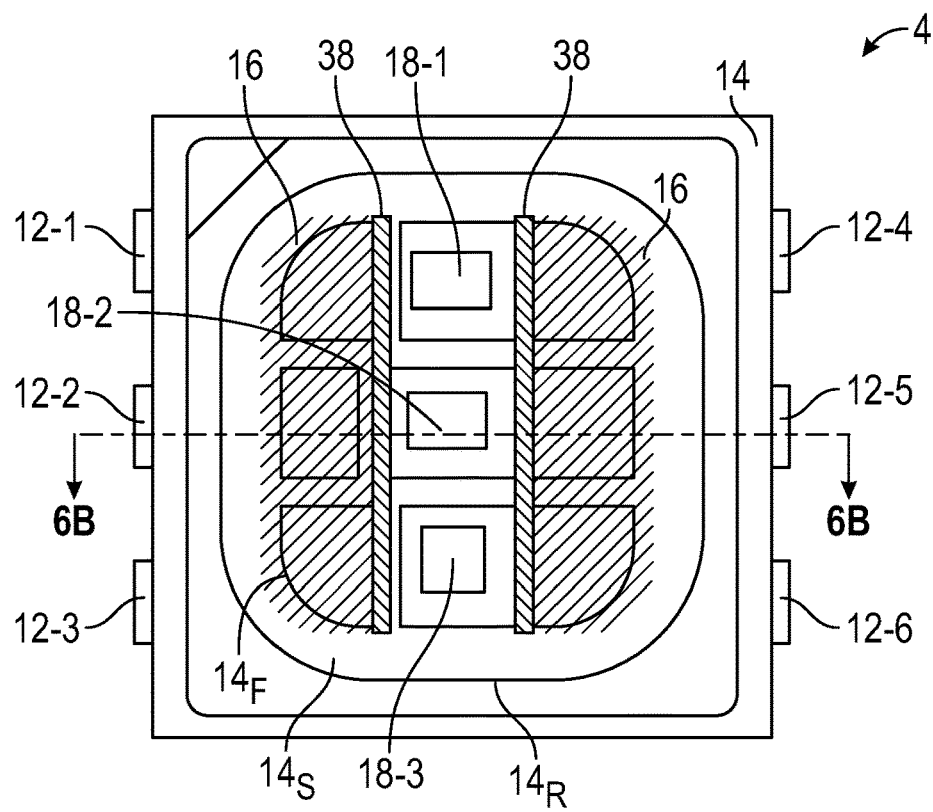
FIG. 6A is a top view of an LED package that is similar to the LED package of FIG. 5A, but where the LED package includes a plurality of LED chips.
Figure 6B:
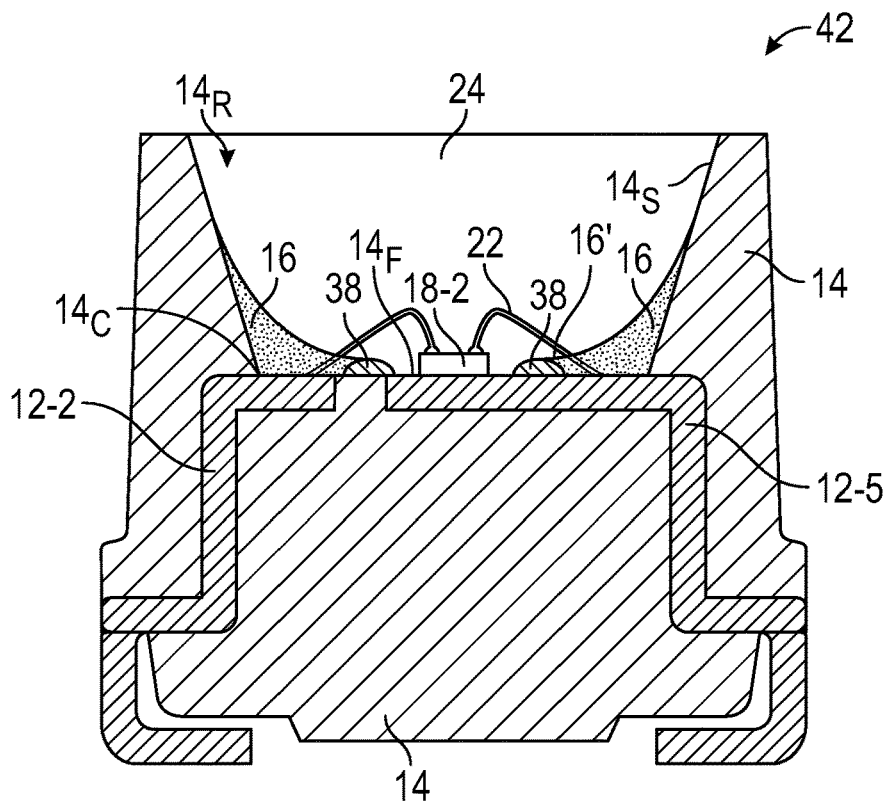
FIG. 6B is a cross-sectional view of the LED package of FIG. 6A taken along the section line 6B-6B of FIG. 6A.

FIG. 6A is a top view of an LED package 42 that is similar to the LED package 36 of FIG. 5A, but where the LED package 42 includes a plurality of LED chips 18-1 to 18-3 and a plurality of leads 12-1 to 12-6. FIG. 6B is a cross-sectional view of the LED package 42 of FIG. 6A taken along the section line 6B-6B of FIG. 6A. As illustrated, a pair of ridges 38 are arranged on either side of the LED chips 18-1 to 18-3 to define boundaries for the light-altering coating 16 along the recess floor 14$_F$. In certain embodiments, inner edges 16' of the light-altering coating 16 are defined at the ridges 38 to provide lateral separation between the light-altering coating 16 and the LED chips 18-1 to 18-3 along the recess floor 14$_F$. As with previous embodiments, the light-altering coating 16 may also be arranged to partially extend along or otherwise cover only portions of the recess sidewalls 14$_S$ as described above for FIG. 1B. In certain embodiments, the inner edges 16' may be formed in a linear manner on opposing sides of the LED chips 18-1 to 18-3. In a similar manner as illustrated for FIG. 2C, the inner edges 16' may be spaced from the LED chips 18-1 to 18-3 in a range that is from about 10% to about 50%, or in a range from about 25% to about 50% of a length or width $18_W$ of individual ones of the LED chips 18-1 to 18-3 as measured along the recess floor $14_F$. In certain embodiments, the inner edges 16' may be spaced from the LED chips 18-1 to 18-3 in a range from 1% to 99%, or in a range from 1% to 25%, or in a range from 1% to 10% of a distance between the LED chips 18-1 to 18-3 and an intersection between the recess floor $14_F$ and the recess sidewalls $14_S$.

Figure 7A:
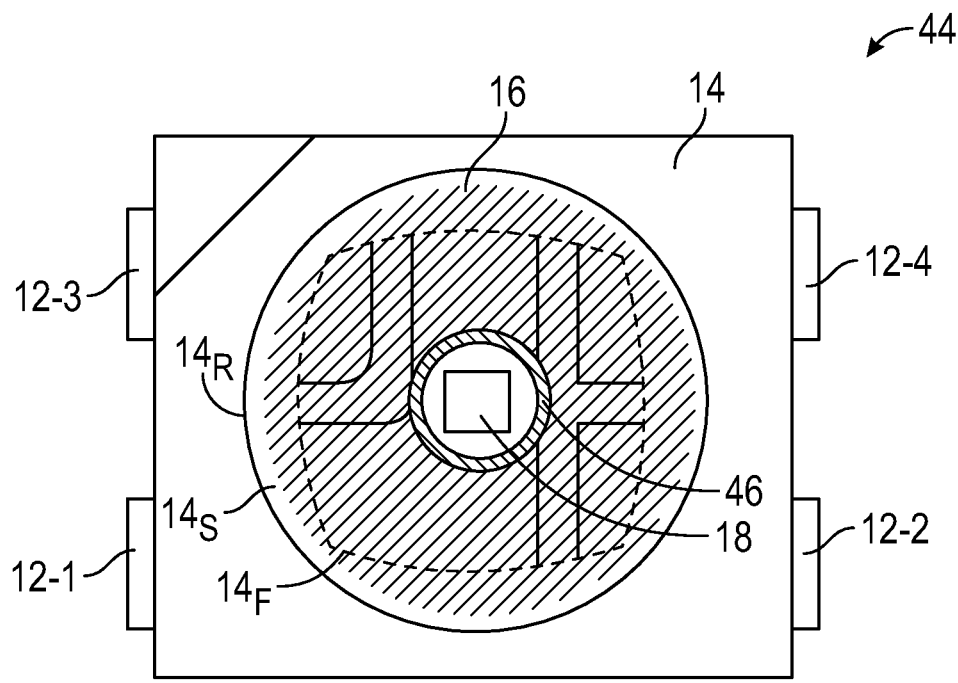
FIG. 7A is a top view of an LED package that is similar to the LED package of FIG. 5A, but where the LED package includes a retention structure in the form of a trench that extends into the recess floor to define a boundary of the light-altering coating.
Figure 7B:
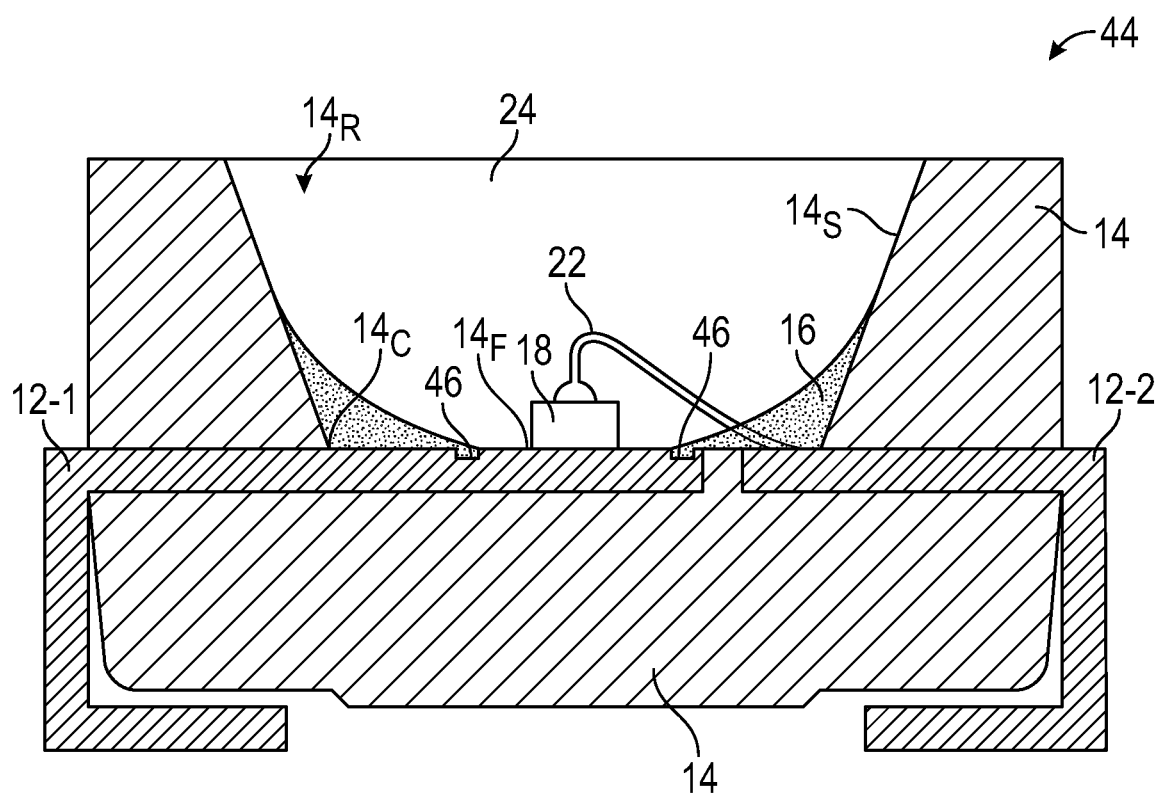
FIG. 7B is a generalized cross-sectional view of the LED package of FIG. 7A.
Figure 7C:
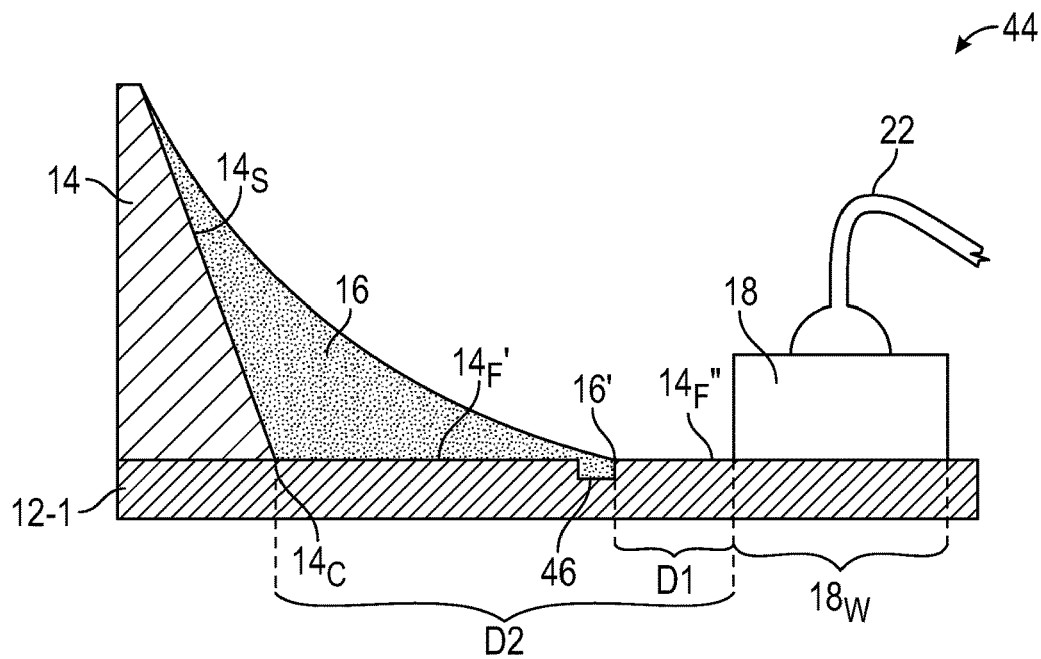
FIG. 7C is an expanded view of a portion of the LED package of FIG. 7B.

FIG. 7A is a top view of an LED package 44 that is similar to the LED package 36 of FIG. 5A, but where the LED package 44 includes a retention structure in the form of a trench 46 that extends into the recess floor $14_F$ to define a boundary of the light-altering coating 16. FIG. 7B is a generalized cross-sectional view of the LED package 44 of FIG. 7A. FIG. 7C is an expanded view of a portion of the LED package 44 of FIG. 7B. For illustrative purposes, the generalized cross-section of FIG. 7B is provided to illustrate the relationship between the leads 12-1, 12-2 of the lead frame structure, the LED chip 18, the light-altering coating 16, and the trench 46. By extending into the recess floor $14_F$, the trench 46 may form a structure that retains the light-altering coating 16 to certain portions of the recess $14_R$. In this manner, the inner edge 16' of the light-altering coating 16 may reside within or otherwise be registered at the trench 46. As illustrated in FIG. 7A, the trench 46 may form a ring shape, such as a circle, oval, square, or rectangle shaped ring, among others around the LED chip 18 along the recess floor $14_F$. While a circle is shown, other shapes, such as a square or rectangle, among others, may also be implemented. In certain embodiments, the trench 46 may laterally extend over portions of both the leads 12-1, 12-2 of the lead frame structure and over portions of the housing 14 that are positioned at the recess floor $14_F$.

In certain embodiments, the trench 46 may be formed by a subtractive process that removes portions of one or more of the leads 12-1, 12-2 and portions of the housing 14 along the recess floor $14_F$. As illustrated in FIG. 7C, the trench 46 may be arranged to position the inner edge 16' of the light-altering coating 16 a distance D1 from the LED chip 18 that is in a range from about 10% to about 50%, or in a range from about 25% to about 50% of a length or width $18_W$ of the LED chip 18 as measured along the recess floor $14_F$. In other embodiments, the distance D1 may be quantified as a percentage of a distance D2 as measured from a side of the LED chip 18 to the intersection of between the recess floor $14_F$ and the recess sidewall $14_S$. In this regard, for embodiments where the light-altering coating 16 extends on the recess floor $14_F$ to be proximate the LED chip 18, the distance D1 may be in a range from 1% to 25%, or in a range from 1% to 10% of the distance D2. In other embodiments, the distance D1 may be in a range from 1% to 99% of the distance D2 without deviating from the principles disclosed. As with previous embodiments, the light-altering coating 16 may also be arranged to partially extend along or otherwise cover only portions of the recess sidewalls $14_S$ as described above for FIG. 1B.

Figure 7D:
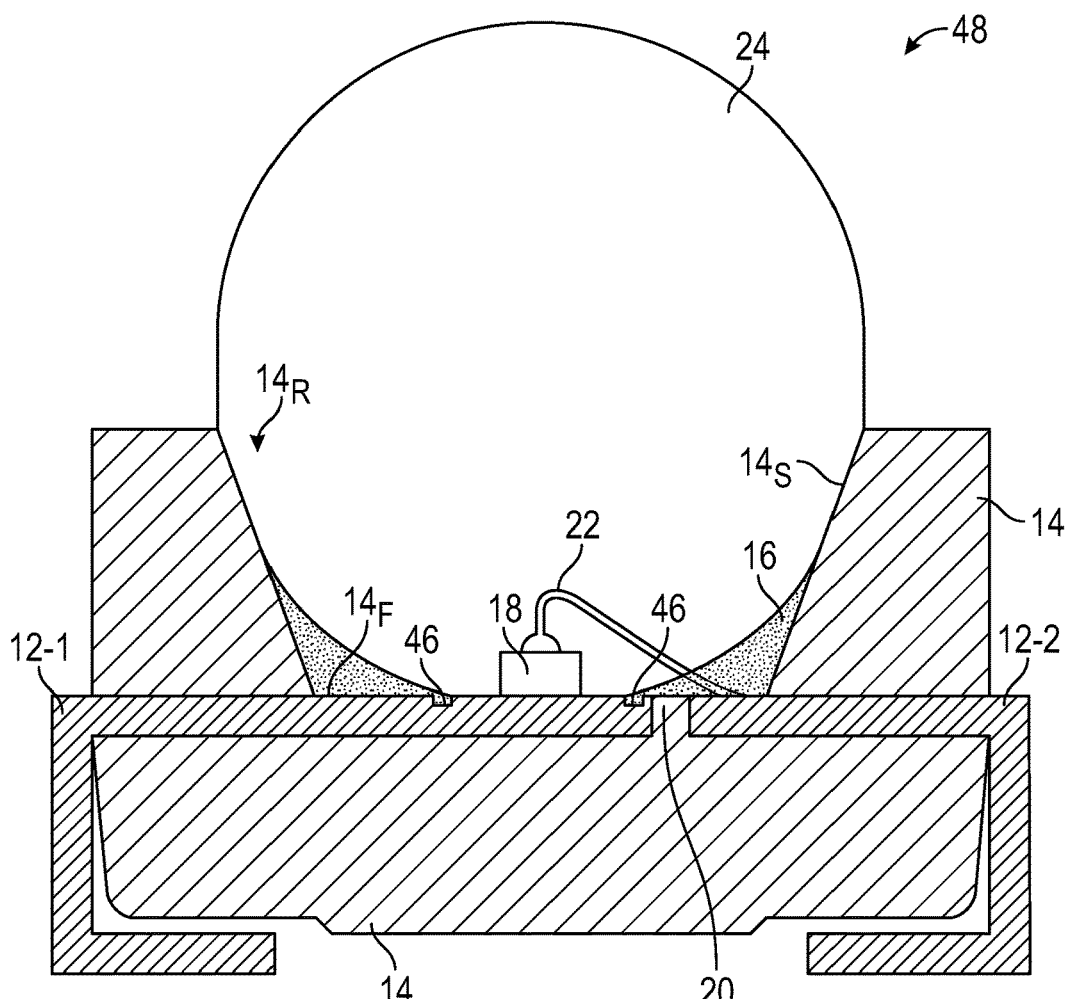
FIG. 7D is a generalized cross-sectional view of an LED package that is the same as the LED package of FIG. 7B, except that the encapsulant forms a nonplanar shape above the housing.

FIG. 7D is a generalized cross-sectional view of an LED package 48 that is the same as the LED package 44 of FIG. 7B, except that the encapsulant 24 forms a nonplanar shape above the housing 14. In this manner, the encapsulant 24 may form a lens that further shapes an emission profile of the LED package 48 in a similar manner as described above for FIG. 1D. For example, the lens may include a shape with a curved or hemispheric top surface, with alternative shapes including ellipsoid bullet, flat, hex-shaped and square. In certain embodiments, a suitable shape includes both curved and planar surfaces, such as a hemispheric top portion with planar side surfaces.

Figure 8A:
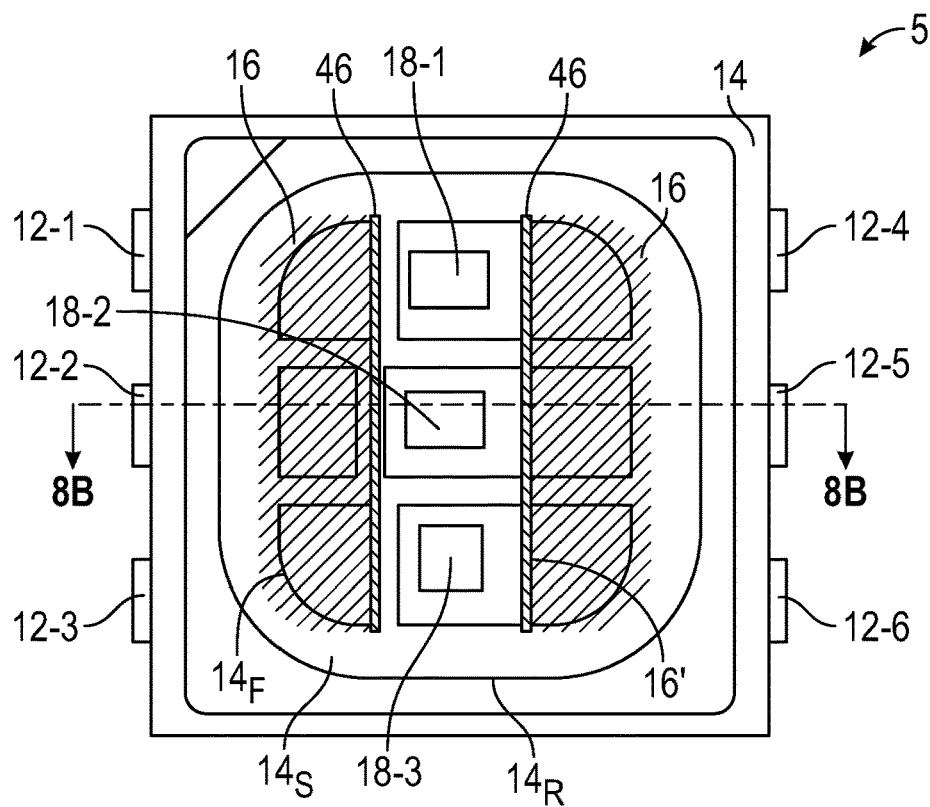
FIG. 8A is a top view of an LED package that is similar to the LED package of FIG. 7A, but where the LED package includes a plurality of LED chips.
Figure 8B:
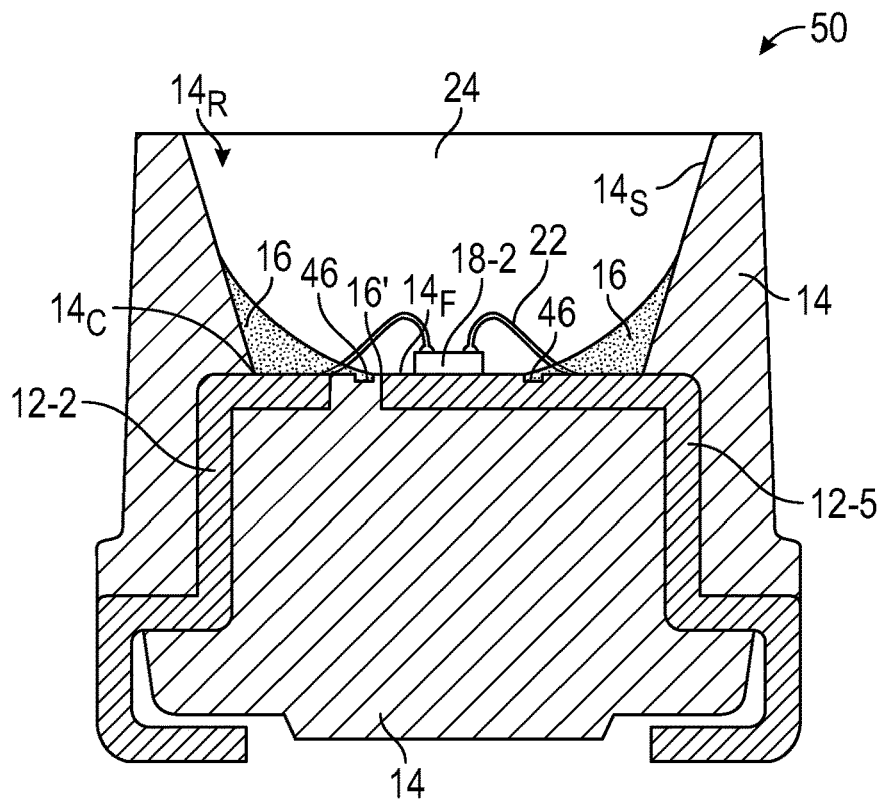
FIG. 8B is a cross-sectional view of the LED package of FIG. 8A taken along the section line 8B-8B of FIG. 8A.

FIG. 8A is a top view of an LED package 50 that is similar to the LED package 44 of FIG. 7A, but where the LED package 50 includes a plurality of LED chips 18-1 to 18-3 and a plurality of leads 12-1 to 12-6. FIG. 8B is a cross-sectional view of the LED package 50 of FIG. 8A taken along the section line 8B-8B of FIG. 8A. As illustrated, a pair of trenches 46 are arranged on either side of the LED chips 18-1 to 18-3 to define boundaries for the light-altering coating 16 along the recess floor $14_F$. In certain aspects, an individual trench 46 may laterally extend through portions of both the housing 14 and one or more of the leads 12-1 to 12-6 along the recess floor $14_F$. In certain embodiments, inner edges 16' of the light-altering coating 16 are defined at the trenches 46 to provide lateral separation between the light-altering coating 16 and the LED chips 18-1 to 18-3 along the recess floor $14_F$. As with previous embodiments, the light-altering coating 16 may also be arranged to partially extend along or otherwise cover only portions of the recess sidewalls $14_S$ as described above for FIG. 1B. In certain embodiments, the inner edges 16' may be formed in a linear manner on opposing sides of the LED chips 18-1 to 18-3. In a similar manner as illustrated for FIG. 2C, the inner edges 16' may be spaced from the LED chips 18-1 to 18-3 in a range that is from about 10% to about 50%, or in a range from about 25% to about 50% of a length or width $18_W$ of individual ones of the LED chips 18-1 to 18-3 as measured along the recess floor $14_F$. In certain embodiments, the inner edges 16' may be spaced from the LED chips 18-1 to 18-3 in a range from 1% to 99%, or in a range from 1% to 25%, or in a range from 1% to 10% of a distance between the LED chips 18-1 to 18-3 and an intersection between the recess floor $14_F$ and the recess sidewalls $14_S$.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
    a housing that forms a recess with a recess floor and one or more recess sidewalls;
    a lead frame structure extending through the housing, wherein a portion of the lead frame structure is arranged along the recess floor;
    at least one LED chip arranged within the recess and electrically coupled with the lead frame structure; and
    a light-altering coating arranged on the one or more recess sidewalls, the recess floor, and the portion of the lead frame structure that is arranged along the recess floor;
    wherein the light-altering coating is arranged on sides of the at least one LED chip at a height above the recess floor that is in range from 50% to 90% of a corresponding height of the at least one LED chip above the recess floor.

2. The LED package of claim 1, wherein the light-altering coating comprises one or more of light-reflective particles and light-absorbing particles suspended in a binder.

3. The LED package of claim 1, wherein the light-altering coating only partially covers the one or more recess sidewalls.

4. The LED package of claim 3, wherein the light-altering coating covers a range from 25% to 75% of the one or more recess sidewalls.

5. The LED package of claim 1, wherein the light-altering coating is formed with a non-uniform thickness along the recess floor.

6. The LED package of claim 1, wherein the light-altering coating forms a curved upper surface that is opposite the recess floor.

7. The LED package of claim 1, further comprising an encapsulant that is arranged within the recess such that the light-altering coating is between the encapsulant and the recess floor.

8. The LED package of claim 7, wherein the encapsulant forms a lens shape above the housing.

9. The LED package of claim 1, wherein the light-altering coating is arranged to only partially cover the recess floor such that an inner edge of the light-altering coating is laterally spaced from the at least one LED chip across the recess floor.

10. A light-emitting diode (LED) package comprising:
a housing that forms a recess with a recess floor and one or more recess sidewalls;
a lead frame structure extending through the housing, wherein a portion of the lead frame structure is arranged along the recess floor;
at least one LED chip arranged within the recess and electrically coupled with the lead frame structure;
at least one retention structure arranged along the recess floor, wherein the at least one retention structure comprises a ridge that is raised above the recess floor; and
a light-altering coating that extends across the recess floor from the recess sidewalls to the at least one retention structure, wherein the ridge comprises a same material as the light-altering coating.

11. The LED package of claim 10, wherein the ridge comprises a different material from the housing.

12. The LED package of claim 10, wherein the ridge extends across portions of the housing and the lead frame structure along the recess floor.

13. The LED package of claim 10, wherein the retention structure forms a ring shape around the at least one LED chip along the recess floor.

14. The LED package of claim 10, wherein the retention structure is arranged in a linear manner along the recess floor.

15. A light-emitting diode (LED) package comprising:
a housing that forms a recess with a recess floor and one or more recess sidewalls;
a lead frame structure extending through the housing, wherein a portion of the lead frame structure is arranged along the recess floor;
at least one LED chip arranged within the recess and electrically coupled with the lead frame structure;
at least one retention structure arranged along the recess floor, wherein the at least one retention structure comprises a ridge that is raised above the recess floor and the ridge comprises a same material as the housing; and
a light-altering coating that extends across the recess floor from the recess sidewalls to the at least one retention structure.

16. The LED package of claim 15, wherein the at least one retention structure forms a ring shape around the at least one LED chip along the recess floor.

17. The LED package of claim 15, wherein the at least one retention structure is arranged in a linear manner along the recess floor.

18. A light-emitting diode (LED) package comprising:
a housing that forms a recess with a recess floor and one or more recess sidewalls;
a lead frame structure extending through the housing, wherein a portion of the lead frame structure is arranged along the recess floor;
at least one LED chip arranged within the recess and electrically coupled with the lead frame structure;
at least one retention structure arranged along the recess floor, wherein the at least one retention structure comprises a trench that extends into the recess floor, wherein the trench laterally extends through both a portion of the housing and a portion of the lead frame structure along the recess floor; and
a light-altering coating that extends across the recess floor from the recess sidewalls to the at least one retention structure.

19. The LED package of claim 18, wherein the at least one retention structure forms a ring shape around the at least one LED chip along the recess floor.

20. The LED package of claim 18, wherein the at least one retention structure is arranged in a linear manner along the recess floor.

* * * * *